US012784828B2

(12) United States Patent
Wu et al.

(10) Patent No.: US 12,784,828 B2
(45) Date of Patent: Nov. 3, 2026

(54) DATA PROCESSING METHOD BASED ON MEMRISTOR ARRAY, AND ELECTRONIC APPARATUS

(71) Applicant: TSINGHUA UNIVERSITY, Beijing (CN)

(72) Inventors: Huaqiang Wu, Beijing (CN); Zhengwu Liu, Beijing (CN); Han Zhao, Beijing (CN); Jianshi Tang, Beijing (CN); Bin Gao, Beijing (CN); He Qian, Beijing (CN)

(73) Assignee: TSINGHUA UNIVERSITY, Beijing (CN)

( * ) Notice: Subject to any disclaimer, the term of this patent is extended or adjusted under 35 U.S.C. 154(b) by 142 days.

(21) Appl. No.: 18/726,931

(22) PCT Filed: Jan. 11, 2022

(86) PCT No.: PCT/CN2022/071337
§ 371 (c)(1),
(2) Date: Jul. 5, 2024

(87) PCT Pub. No.: WO2023/130487
PCT Pub. Date: Jul. 13, 2023

(65) Prior Publication Data
US 2025/0078924 A1 Mar. 6, 2025

(30) Foreign Application Priority Data
Jan. 7, 2022 (CN) ......................... 202210016618.1

(51) Int. Cl.
*G11C 13/00* (2006.01)
*G06F 17/16* (2006.01)

(52) U.S. Cl.
CPC .......... *G11C 13/0069* (2013.01); *G06F 17/16* (2013.01); *G11C 13/0026* (2013.01);
(Continued)

(58) Field of Classification Search
CPC ............ G11C 13/0069; G11C 13/0026; G11C 13/0028; G11C 13/003; G11C 2213/79; G06F 17/16
See application file for complete search history.

(56) References Cited

U.S. PATENT DOCUMENTS 10,497,442 B1 12/2019 Kumar et al.
11,853,385 B2 * 12/2023 Luo ...................... G11C 7/1006
(Continued)

FOREIGN PATENT DOCUMENTS

CN 107615389 A 1/2018
CN 109417531 A 3/2019
(Continued)

OTHER PUBLICATIONS

Liu Z. et al., "Neural Signal Analysis With Memristor Arrays Towards High-Efficiency Brain-Machine Interfaces", Nature Communications 4234:1-9 (2020).
(Continued)

*Primary Examiner* — Vanthu T Nguyen
(74) *Attorney, Agent, or Firm* — Scully, Scott, Murphy & Presser, P.C.

(57) ABSTRACT

At least one embodiment of the present disclosure provides a data processing method based on a memristor array and an electronic apparatus. The data processing method includes: acquiring a plurality of first analog signals; setting the memristor array, and writing data of a parameter matrix corresponding to the data processing into the memristor array; and inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing
(Continued)

at a plurality of row signal output terminals of the memristor array, respectively.

17 Claims, 8 Drawing Sheets

(52) U.S. Cl.
CPC ........ *G11C 13/0028* (2013.01); *G11C 13/003* (2013.01); *G11C 2213/79* (2013.01)

(56) References Cited

U.S. PATENT DOCUMENTS

| | | | |
|---|---|---|---|
| 2017/0228345 | A1 | 8/2017 | Gupta et al. |
| 2021/0382961 | A1 | 12/2021 | Kirchner |

FOREIGN PATENT DOCUMENTS

| | | | |
|---|---|---|---|
| CN | 111276248 | A | 6/2020 |
| CN | 112150343 | A | 12/2020 |
| CN | 113011574 | A | 6/2021 |
| CN | 113077829 | A | 7/2021 |
| CN | 113222128 | A | 8/2021 |
| CN | 113643175 | A | 11/2021 |
| CN | 113658625 | A | 11/2021 |
| CN | 113824483 | A | 12/2021 |
| WO | 2021/088248 | A1 | 5/2021 |

OTHER PUBLICATIONS

Tan J-P et al., "Design and Simulation of a Memtistive Crossbar Array Fuzzy PID Controller", Journal of Southwest University (Natural Science Edition) 40(2):146-156 (Feb. 2018).

Chinese Office Action dated Mar. 10, 2026 received in Chinese Application No. 202210016618.1.

International Search Report and Written Opinion dated Sep. 27, 2022 received in International Application No. PCT/CN2022/071337.

* cited by examiner

DATA PROCESSING METHOD BASED ON MEMRISTOR ARRAY, AND ELECTRONIC APPARATUS

CROSS-REFERENCE TO RELATED APPLICATIONS

The present application is a U.S. National Phase Entry under 35 U.S.C. § 371 of PCT International Patent Application No. PCT/CN2022/071337, filed on Jan. 11, 2022, which claims priority of the Chinese Patent Application No. 202210016618.1, filed on Jan. 7, 2022, the entire contents of each of which are incorporated herein by reference as a part of the present application.

TECHNICAL FIELD

Embodiments of the present disclosure relate to a data processing method based on a memristor array, and an electronic apparatus.

BACKGROUND

With progress of science and technology and rapid development of information technology, people may collect a large amount of data through IoT sensing technology, and it is necessary to analyze and process the large amount of data with low power consumption and high energy efficiency to quickly extract data features and information.

A memristor (e.g., a resistive random-access memory, a phase change memory, a conductive bridging memory, etc.) is a new type of micro-nano electronic device that may adjust a conductivity state thereof by applying external excitation. Neuromorphic computation based on memristors breaks through the von Neumann architecture of the traditional computing device, and completes computation and storage in a same place, which reduces data transfer time, and requires higher energy efficiency, lower power consumption and smaller area for computation. Analog computation based on a memristor array by using physical laws is a hot research field in recent years.

SUMMARY

At least one embodiment of the present disclosure provides a data processing method based on a memristor array, the data processing comprises a matrix-vector multiplication operation in complex domain, the memristor array comprises a plurality of memristor units arranged in an array and is configured to be capable of performing a multiplication-addition operation, the data processing method includes: acquiring a plurality of first analog signals; setting the memristor array, and writing data of a parameter matrix corresponding to the data processing into the memristor array, wherein a matrix in the complex domain comprises a real-portion matrix and an imaginary-portion matrix; the parameter matrix comprises the real-portion matrix, the imaginary-portion matrix, and an imaginary-portion negative matrix obtained based on the imaginary-portion matrix; a plurality of parameter elements in the imaginary-portion negative matrix is in one-to-one correspondence with a plurality of parameter elements in the imaginary-portion matrix, and each parameter element in the imaginary-portion negative matrix is a negative value of a corresponding parameter element in the imaginary-portion matrix; and inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing at a plurality of row signal output terminals of the memristor array, respectively.

For example, in the data processing method provided by at least one embodiment of the present disclosure, the memristor array comprises a first sub-array, a second sub-array, a third sub-array and a fourth sub-array, setting the memristor array, and writing the data of the parameter matrix corresponding to the data processing into the memristor array, comprises: mapping a plurality of parameter elements in the real-portion matrix to the first sub-array and the fourth sub-array, respectively, in a form of the real-portion matrix, mapping the plurality of parameter elements in the imaginary-portion matrix to the third sub-array in a form of the imaginary-portion matrix, and mapping the plurality of parameter elements in the imaginary-portion negative matrix to the second sub-array in a form of the imaginary-portion negative matrix, wherein the first sub-array and the second sub-array are located in a same row in the memristor array but do not overlap with each other in a row direction, the third sub-array and the fourth sub-array are located in a same row in the memristor array but do not overlap with each other in the row direction, and the first sub-array and the third sub-array do not overlap with each other in a column direction.

For example, in the data processing method provided by at least one embodiment of the present disclosure, the first sub-array and the third sub-array are located in a same column in the memristor array, and the second sub-array and the fourth sub-array are located in a same column in the memristor array.

For example, in the data processing method provided by at least one embodiment of the present disclosure, the memristor array comprises at least 2N rows and 2M columns, the first sub-array comprises an i-th row to an (i+N−1)-th row and a j-th column to a (j+M−1)-th column in the memristor array, the second sub-array comprises an i-th row to an (i+N−1)-th row, and a (j+k+M−1)-th column to a (j+k+2*M−2)-th column in the memristor array, the third sub-array comprises an (i+g+N−1)-th row to an (i+g+2N−2)-th row, and a j-th column to a (j+M−1)-th column in the memristor array, the fourth sub-array comprises an (i+g+N−1)-th row to an (i+g+2N−2)-th row, and a (j+k+M−1)-th column to a (j+k+2*M−2)-th column in the memristor array, and wherein M, N, i, j, k and g are positive integers.

For example, in the data processing method provided by at least one embodiment of the present disclosure, the real-portion matrix comprises the plurality of parameter elements arranged in an array of N rows and M columns, mapping the plurality of parameter elements in the real-portion matrix to the first sub-array and the fourth sub-array, respectively, in the form of the real-portion matrix, comprises: mapping N parameter elements located in a same row in the real-portion matrix to N memristor units of a same row in the first sub-array, and N memristor units of a same row in the fourth sub-array, respectively; and mapping M parameter elements located in a same column in the real-portion matrix to M memristor units of a same column in the first sub-array, and M memristor units of a same column in the fourth sub-array, respectively.

For example, in the data processing method provided by at least one embodiment of the present disclosure, each of the plurality of first analog signals comprises a first real-portion analog signal and a first imaginary-portion analog signal, acquiring the plurality of first analog signals, comprises: acquiring a vector in the complex domain used for the data processing, wherein the vector in the complex domain comprises a real-portion vector and an imaginary-portion vector; and encoding the real-portion vector and the imaginary-portion vector, respectively, to obtain a plurality of first real-portion analog signals and a plurality of first imaginary-portion analog signals.

For example, in the data processing method provided by at least one embodiment of the present disclosure, inputting the plurality of first analog signals into the plurality of column signal input terminals of the set memristor array, respectively, comprises: inputting the plurality of first real-portion analog signals into column signal input terminals of the first sub-array and column signal input terminals of the third sub-array, respectively; and inputting the plurality of first imaginary-portion analog signals into column signal input terminals of the second sub-array and column signal input terminals of the fourth sub-array, respectively.

For example, in the data processing method provided by at least one embodiment of the present disclosure, each of the plurality of second analog signals comprises a second real-portion analog signal and a second imaginary-portion analog signal, the first sub-array and the second sub-array share a same row signal output terminal, and the third sub-array and the fourth sub-array share a same row signal output terminal, obtaining the plurality of second analog signals after performing the data processing at the plurality of row signal output terminals of the memristor array, respectively, comprises: obtaining a plurality of second real-portion analog signals according to current signals that are output from row signal output terminals of the first sub-array; and obtaining a plurality of second imaginary-portion signals according to current signals that are output from row signal output terminals of the third sub-array.

For example, the data processing method provided by at least one embodiment of the present disclosure further includes: performing analog-to-digital conversion on the plurality of second analog signals to obtain a real-portion operation result of the matrix-vector multiplication operation; and performing the analog-to-digital conversion on the plurality of second imaginary-portion analog signals to obtain an imaginary-portion operation result of the matrix-vector multiplication operation.

For example, in the data processing method provided by at least one embodiment of the present disclosure, the parameter matrix is represented as:

$$W_t = \begin{bmatrix} W_{real} & -W_{img} \\ W_{img} & W_{real} \end{bmatrix}$$

wherein $W_{real}$ is the real-portion matrix, $W_{img}$ is the imaginary-portion matrix, and $-W_{img}$ is the imaginary-portion negative matrix.

For example, in the data processing method provided by at least one embodiment of the present disclosure, the parameter matrix comprises P rows and Q columns, and a parameter element in an m-th row and an n-th column in the parameter matrix is jointly represented by a parameter element in an m-th row and an n-th column in a first sub-matrix and a parameter element in an m-th row and an n-th column in a second sub-matrix, wherein m, n, P and Q are positive integers, the first sub-matrix comprises P rows of first parameter elements, the second sub-matrix comprises P rows of second parameter elements, the P rows of first parameter elements are in one-to-one correspondence with the P rows of second parameter elements in terms of row and column position, the first sub-matrix and the second sub-matrix are arranged in a form of a first matrix of 2P rows and Q columns, and setting the memristor array, and writing the data of the parameter matrix corresponding to the data processing into the memristor array, comprises: mapping the first sub-matrix and the second sub-matrix to the memristor array in the form of the first matrix.

For example, in the data processing method provided by at least one embodiment of the present disclosure, obtaining the plurality of second analog signals after performing the data processing at the plurality of row signal output terminals of the memristor array, respectively, comprises: determining at least one group of rows to be processed, wherein each group of the at least one group of rows to be processed comprises a row of target memristor units corresponding to a row in the P rows of first parameter elements, and a row of target memristor units corresponding to a row in the P rows of second parameter elements that corresponds to a row in the P rows of first parameter elements; and performing current preprocessing on current signals of two row signal output terminals of the plurality of row signal output terminals that respectively correspond to the two rows of target memristor units comprised in each group of the at least one group of rows to be processed, to obtain the plurality of second analog signals corresponding to each group of the at least one group of rows to be processed.

For example, in the data processing method provided by at least one embodiment of the present disclosure, the memristor array comprises a first memristor array and a second memristor array, a parameter element in a u-th row and a v-th column in the parameter matrix is jointly represented by a parameter element in a u-th row and a v-th column in a first sub-matrix and a parameter element in a u-th row and a v-th column in a second sub-matrix, wherein u and v are positive integers, both the first sub-matrix and the second sub-matrix have a same matrix form as the parameter matrix, and setting the memristor array, and writing the data of the parameter matrix corresponding to the data processing into the memristor array, comprises: mapping the first sub-matrix to the first memristor array in a form of the parameter matrix, correspondingly, and mapping the second sub-matrix to the second memristor array in the form of the parameter matrix, correspondingly.

For example, in the data processing method provided by at least one embodiment of the present disclosure, obtaining the plurality of second analog signals after performing the data processing at the plurality of row signal output terminals of the memristor array, respectively, comprises: performing current preprocessing on a current signal of each row signal output terminal of the plurality of row signal output terminals in the first memristor array and a current signal of each corresponding row signal output terminal of the plurality of row signal output terminals in the second memristor array, to obtain the plurality of second analog signals.

For example, in the data processing method provided by at least one embodiment of the present disclosure, the current preprocessing is current subtraction processing or current addition processing.

For example, in the data processing method provided by at least one embodiment of the present disclosure, the data processing is discrete Fourier transform, and the matrix in the complex domain is a coefficient matrix of the discrete Fourier transform, the real-portion matrix is a real portion of the coefficient matrix, and the imaginary-portion matrix is an imaginary portion of the coefficient matrix.

At least one embodiment of the present disclosure provides an electronic apparatus, which includes: a memristor array, configured to be capable of performing a multiplication-addition operation; a signal acquiring apparatus, configured to acquire a plurality of first analog signals; a control driving circuit, configured to execute steps of: setting the memristor array, and writing data of a parameter matrix corresponding to the data processing into the memristor array, wherein a matrix in the complex domain comprises a real-portion matrix and an imaginary-portion matrix; the parameter matrix comprises the real-portion matrix, the imaginary-portion matrix, and an imaginary-portion negative matrix obtained based on the imaginary-portion matrix; a plurality of parameter elements in the imaginary-portion negative matrix is in one-to-one correspondence with a plurality of parameter elements in the imaginary-portion matrix, and each parameter element in the imaginary-portion negative matrix is a negative value of a corresponding parameter element in the imaginary-portion matrix; and inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing at a plurality of row signal output terminals of the memristor array, respectively.

For example, in the electronic apparatus provided by at least one embodiment of the present disclosure, the memristor array comprises a first sub-array, a second sub-array, a third sub-array and a fourth sub-array, the control driving circuit, when executing setting the memristor array, and writing the data of the parameter matrix corresponding to the data processing into the memristor array, is configured to execute steps of: mapping a plurality of parameter elements in the real-portion matrix to the first sub-array and the fourth sub-array, respectively, in a form of the real-portion matrix, mapping the plurality of parameter elements in the imaginary-portion matrix to the third sub-array in a form of the imaginary-portion matrix, and mapping the plurality of parameter elements in the imaginary-portion negative matrix to the second sub-array in a form of the imaginary-portion negative matrix, wherein the first sub-array and the second sub-array are located in a same row in the memristor array but do not overlap with each other in a row direction, the third sub-array and the fourth sub-array are located in a same row in the memristor array but do not overlap with each other in the row direction, and the first sub-array and the third sub-array do not overlap with each other in a column direction.

BRIEF DESCRIPTION OF DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
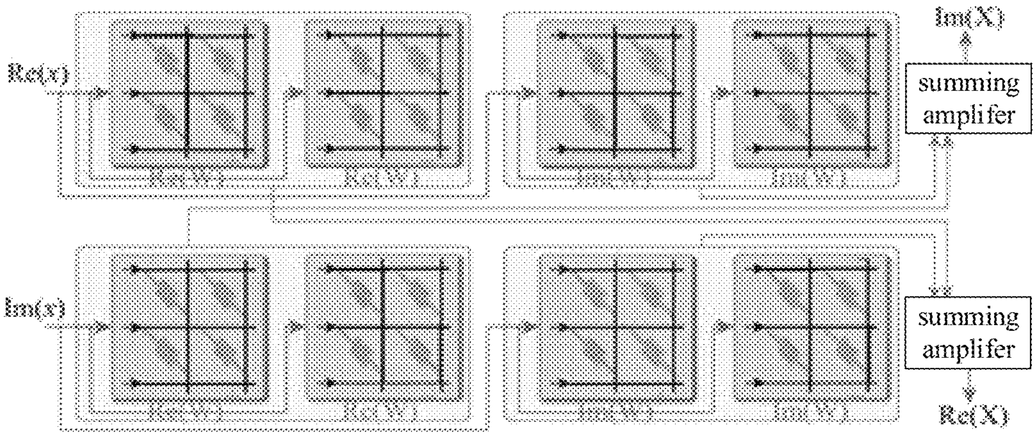
FIG. 1 shows a DFT implementing method based on a memristor array.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Likewise, the terms "a," "an," "one," or "the," etc., do not denote a limitation of quantity, but mean that there is at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below through several specific embodiments. To keep the following description of the embodiments of the present disclosure clear and concise, detailed descriptions of well-known functions and well-known components may be omitted. When any component of an embodiment of the present disclosure appears in more than one drawing, the component is denoted by the same reference numeral in each drawing.

Discrete Fourier Transform (DFT) is a commonly used signal processing algorithm that transforms a signal from time domain to frequency domain. Definition of DFT may be represented by a formula below:

$$y[b] = \sum_{a=0}^{N-1} e^{-i\frac{2\pi}{N}ab} x[a],\ b = 0,1,2,\ \ldots\ ,N-1 \qquad \text{formula (1)}$$

In formula (1), x[a] is a complex number, representing time-domain sampling of an input signal; y[b] is a complex number, representing frequency-domain sampling of an output signal; N is a real number, representing a length of a signal segment; and i is an imaginary unit.

For example, the above-described DFT calculation formula may be rewritten as:

$$y = Wx = y_{real} + iy_{img} = (W_{real}x_{real} - W_{img}x_{img}) + i(W_{real}x_{img} + W_{img}x_{real}) \qquad \text{formula (2)}$$

In formula (2), the output signal $y=y_{real}+iy_{img}$ is a frequency-domain sampling vector of the signal, the input signal $x=x_{real}+ix_{img}$ is a time-domain sampling vector of the signal, $W=W_{real}+iW_{img}$ is a coefficient matrix of discrete Fourier transform, and $W_{real}$ and $W_{img}$ are a real portion and an imaginary portion of W, respectively.

For example, $W_{real}$ and $W_{img}$ may be respectively represented by formula (3) and formula (4):

$$W_{real} = \left(\cos\frac{2\pi ab}{N}\right)_{b,a} = \begin{bmatrix} \cos\frac{2\pi 00}{N} & \ldots & \cos\frac{2\pi(N-1)0}{n} \\ \vdots & \ddots & \vdots \\ \cos\frac{2\pi 0(N-1)}{N} & \ldots & \cos\frac{2\pi(N-1)(N-1)}{N} \end{bmatrix} \qquad \text{formula (3)}$$

$$W_{img} = \left(\sin\frac{-2\pi ab}{N}\right)_{b,a} = \begin{bmatrix} -\sin\frac{2\pi 00}{N} & \ldots & -\sin\frac{2\pi(N-1)0}{n} \\ \vdots & \ddots & \vdots \\ -\sin\frac{2\pi 0(N-1)}{N} & \ldots & -\sin\frac{2\pi(N-1)(N-1)}{N} \end{bmatrix} \qquad \text{formula (4)}$$

In formula (3) and formula (4), 2π00 represents 2×π×0×0=0, 2π(N−1)0 represents 2×π×(N−1)×0=0, 2π(N−1)(N−1) represents 2×π×(N−1)×(N−1), and so on.

FIG. 1 shows a DFT implementing method based on a memristor array. As shown in FIG. 1, the solution mainly utilizes characteristics of memristors to implement vector matrix multiplication, and conductivity matrices of two memristor arrays are used to map the real portion $W_{real}$ and the imaginary portion $W_{img}$ of the DFT matrix, respectively. The real portion Re(x) (i.e., $x_{real}$ in formula (2)) and the imaginary portion Im(x) (i.e., $x_{img}$ in formula (2)) of the input signal are respectively represented by voltage pulses, and added to corresponding arrays, to obtain four operation intermediate results (operation intermediate terms) of $Re(W)^+$ (i.e., $W_{real}x_{real}$ in formula (2)), $Re(W)^-$ (i.e., $W_{img}x_{img}$ in formula (2)), $Im(W)^+$ (i.e., $W_{real}x_{img}$ in formula (2)), and $Im(W)^-$ (i.e., $W_{img}x_{real}$ in formula (2)). The four results implement functions such as addition and subtraction through circuits such as operational amplifiers outside the array, to finally obtain the real portion Re(X) (i.e., $y_{real}$ in formula (2)) and the imaginary portion Im(X) (i.e., $y_{img}$ in formula (2)) of the DFT calculation result, so as to obtain the complete DFT calculation result.

In the above-described DFT implementing method based on the memristor array, in addition to the memristor array itself performing the vector matrix multiplication operation, a peripheral auxiliary operation circuit is also required to execute respective addition and subtraction operations. However, the auxiliary operational circuit such as the operational amplifier has significant area overhead. If each output corresponds to use of 2 operational amplifiers (one for subtraction in $W_{real}x_{real}-W_{img}x_{img}$ and one for addition in $W_{real}x_{img}+W_{img}x_{real}$), then 2×N (e.g., 128, 256) operational amplifiers are required for N (e.g., 64, 128)-point DFT, which increases additional circuit area and computational power consumption overhead.

At least one embodiment of the present disclosure provides a data processing method based on a memristor array and an electronic apparatus. The data processing method based on the memristor array includes: acquiring a plurality of first analog signals; setting the memristor array, and writing data of a parameter matrix corresponding to the data processing into the memristor array, wherein a matrix in the complex domain comprises a real-portion matrix and an imaginary-portion matrix; the parameter matrix comprises the real-portion matrix, the imaginary-portion matrix, and an imaginary-portion negative matrix obtained based on the imaginary-portion matrix; a plurality of parameter elements in the imaginary-portion negative matrix is in one-to-one correspondence with a plurality of parameter elements in the imaginary-portion matrix, and each parameter element in the imaginary-portion negative matrix is a negative value of a corresponding parameter element in the imaginary-portion matrix; inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing at a plurality of row signal output terminals of the memristor array, respectively.

The data processing method based on the memristor array performs a deformed design on operation formulas for the matrix-vector multiplication operation in complex domain to obtain a corresponding parameter matrix, and the parameter matrix is mapped to the memristor array, so that a result of the matrix-vector multiplication operation in the complex domain can be obtained in one calculation, which reduces area and power consumption overhead of the auxiliary operation circuits in the periphery of the memristor array.

At least one embodiment of the present disclosure further provides an electronic apparatus corresponding to the data processing method based on the memristor array.

Hereinafter, embodiments of the present disclosure are illustrated in detail in conjunction with drawings, but the present disclosure is not limited to these specific embodiments.

Figure 2:
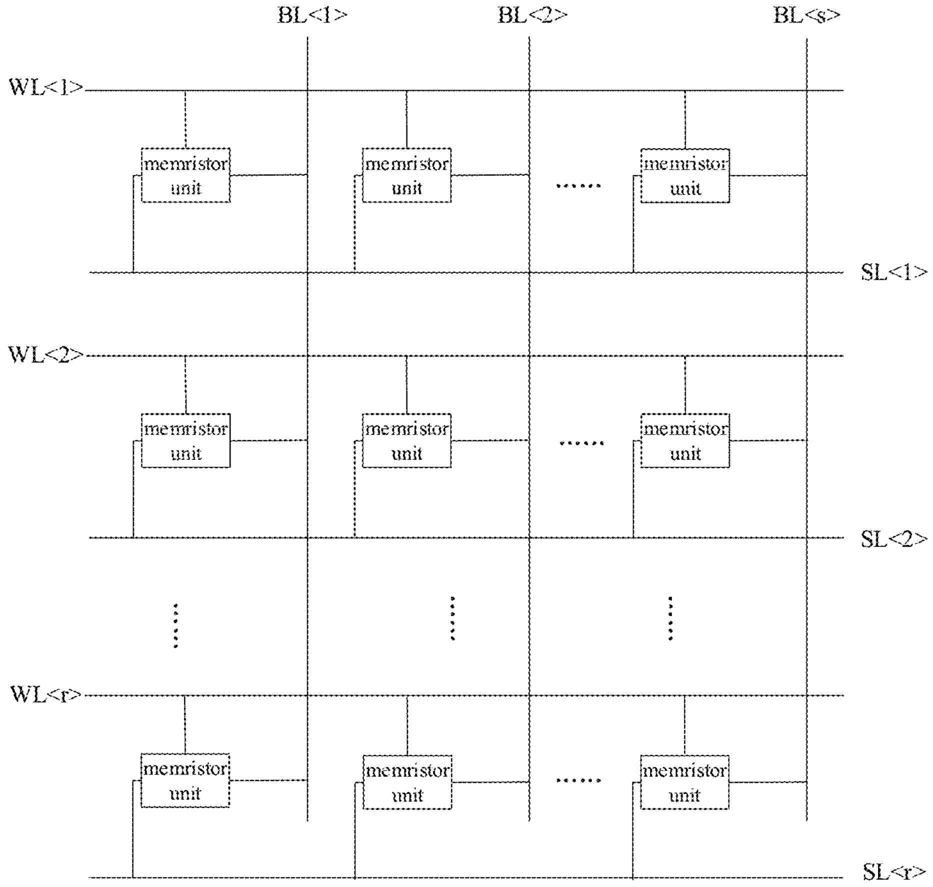
FIG. 2 shows a schematic structure of a memristor array.

FIG. 2 shows a schematic structure of a memristor array; the memristor array is constituted by a plurality of memristor units, the plurality of memristor units constitute an array of r rows and s columns, where both r and s are positive integers. Each memristor unit includes a switching element and one or more memristors. In FIG. 2, WL<1>, WL<2>, . . . , WL<r> represent word lines in a first row, a second row . . . , and an r-th row, respectively, and control electrodes of switching elements in memristor units of each row (e.g., gate electrodes of transistors) are connected with a word line corresponding to the row; BL<1>, BL<2>, . . . , BL<s> represent bit lines in a first column, a second column . . . , and an s-th column, respectively, and memristors in memristor units of each column are connected with a bit line corresponding to the column; SL<1>, SL<2>, . . . , SL<r> represent source lines of a first row, a second row . . . , and an r-th row, respectively, and source electrodes of transistors in memristor units of each row are connected with a source line corresponding to the row. According to Kirchhoff's law, by setting states (e.g., resistance values or conductivity values) of the memristor units and applying a word line signal and a bit line signal correspondingly on the word line and the bit line, the above-described memristor array may complete multiplication and accumulation operation in parallel.

The memristor unit in the memristor array shown in FIG. 2, for example, may have either a 1T1R structure or a 2T2R structure, the memristor unit with the 1T1R structure includes one transistor and one memristor, and the memristor unit with the 2T2R structure includes two transistors and two memristors. It should be noted that the structure of the memristor unit is not limited in the present disclosure, and other structural form of memristor unit for implementing the multiplication and accumulation operation may also be adopted.

It should be noted that the transistors adopted in the embodiments of the present disclosure may all be thin film transistors or field-effect transistors (e.g., MOS field-effect transistors) or other switching devices with similar characteristics. A source electrode and a drain electrode of the transistor used here may be symmetrical in structure, so the source electrode and the drain electrode thereof may be indistinguishable in structure. In the embodiments of the present disclosure, in order to distinguish the two electrodes (i.e., the source electrode and the drain electrode) of the transistor other than the gate electrode, one of the electrodes is directly described as a first electrode and the other is directly described as a second electrode.

Figure 3A:
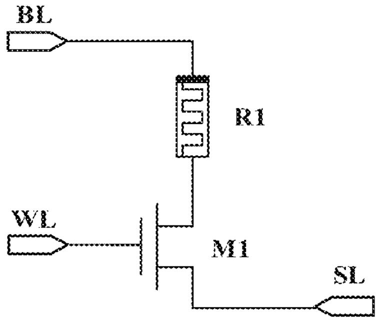
FIG. 3A is a schematic diagram of a memristor unit with a 1T1R structure.

FIG. 3A is a schematic diagram of a memristor unit with a 1T1R structure. As shown in FIG. 3A, the memristor unit with the 1T1R structure includes one transistor M1 and one memristor R1.

The types of transistors adopted in the embodiment of the present disclosure are not limited, for example, when the transistor M1 is an N-type transistor, a gate electrode thereof is connected with a word line WL, for example, the transistor M1 is turned on when the word line WL is input with a high level; a first electrode of the transistor M1 may be a source electrode and configured to be connected with a source line SL, for example, the transistor M1 may receive a reset voltage through the source line SL; a second electrode of the transistor M1 may be a drain electrode and configured to be connected with a second electrode (e.g., a negative electrode) of the memristor R1, and a first electrode (e.g., a positive electrode) of the memristor R1 is connected with a bit line BL, for example, the memristor R1 may receive a set voltage through the bit line BL. For example, when the transistor M1 is a P-type transistor, a gate electrode thereof is connected with the word line WL, for example, the transistor M1 is turned on when the word line WL is input with a low level; a first electrode of the transistor M1 may be a drain electrode and configured to be connected with the source line SL, for example, the transistor M1 may receive a reset voltage through the source line SL; a second electrode of the transistor M1 may be a source electrode and configured to be connected with a second electrode (e.g., a negative electrode) of the memristor R1, and a first electrode (e.g., a positive electrode) of the memristor R1 is connected with the bit line BL, for example, the memristor R1 may receive a set voltage through the bit line BL. It should be noted that the memristor structure may also be implemented as other structure, such as a structure in which the second electrode of the memristor R1 is connected with the source line SL, which is not limited in the embodiments of the present disclosure.

The following embodiments are illustrated by taking the transistor M1 as the N-type transistor.

A word line terminal WL plays a role in applying a corresponding voltage to the gate electrode of the transistor M1, so as to control ON or OFF of the transistor M1. When performing an operation, for example, a set operation or a reset operation, on the memristor R1, the transistor M1 needs to be turned on firstly, that is, an ON voltage needs to be applied to the gate electrode of the transistor M1 through the word line terminal WL. After transistor M1 is turned on, for example, a voltage may be applied to the memristor R1 at a source line terminal SL and a bit line terminal BL to change a resistance state of the memristor R1. For example, a set voltage may be applied through the bit line terminal BL so that the memristor R1 is in a low resistance state; for example, a reset voltage may be applied through the source line terminal SL so that the memristor R1 is in a high resistance state. For example, a resistance value of a high resistance state is more than 100 times, for example, more than 1,000 times that of a low resistance state.

It should be noted that in the embodiments of the present disclosure, by simultaneously applying a voltage through the word line terminal WL and the bit line terminal BL, the resistance value of the memristor R1 may decrease, that is, the memristor R1 may change from a high resistance state to a low resistance state, and the operation of changing the memristor R1 from a high resistance state to a low resistance state is referred to as a set operation; by simultaneously applying a voltage through the word line terminal WL and the source line terminal SL, the resistance value of the memristor R1 may increase, that is, the memristor R1 may change from a low resistance state to a high resistance state, and the operation of changing the memristor R1 from a low resistance state to a high resistance state is referred to as a reset operation. For example, the memristor R1 has a threshold voltage; and when an input voltage amplitude is less than the threshold voltage of the memristor R1, the resistance value (or the conductivity value) of the memristor R1 is not changed. In such case, the resistance value (or the conductivity value) of the memristor R1 may be calculated by inputting a voltage less than the threshold voltage; and the resistance value (or the conductivity value) of the memristor R1 may be changed by inputting a voltage greater than the threshold voltage.

Figure 3B:
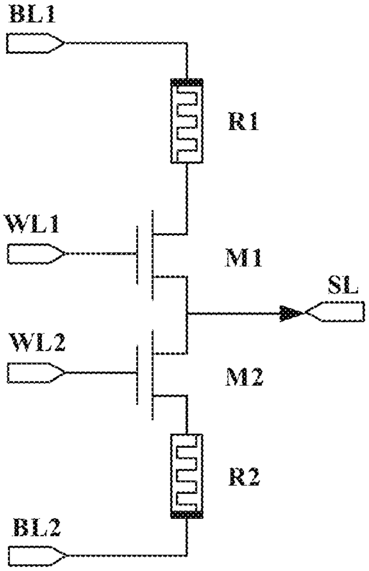
FIG. 3B is a schematic diagram of a memristor unit with a 2T2R structure.

FIG. 3B is a schematic diagram of a memristor unit with a 2T2R structure. As shown in FIG. 3B, the memristor unit with the 2T2R structure includes two transistors M1 and M2, as well as two memristors R1 and R2. Hereinafter, it is illustrated by taking both the transistors M1 and M2 as N-type transistors.

A gate electrode of the transistor M1 is connected with a word line terminal WL1, for example, the transistor M1 is turned on when the word line terminal WL1 of M1 is input with a high level; a gate electrode of the transistor M2 is connected with a word line terminal WL2, for example, the transistor M2 is turned on when the word line terminal WL2 of M2 is input with a high level; a first electrode of the transistor M1 may be a source electrode and configured to be connected with the source line terminal SL, for example, the transistor M1 may receive a reset voltage through the source line terminal SL; a first electrode of the transistor M2 may be a source electrode and configured to be connected with the source line terminal SL, for example, the transistor M2 may receive a reset voltage through the source line terminal SL; the first electrode of the transistor M1 is connected with the first electrode of the transistor M2, and the two are coupled to the source line terminal SL together. A second electrode of the transistor M1 may be a drain electrode and configured to be connected with a second electrode (e.g., a negative electrode) of the memristor R1, and a first electrode (e.g., a positive electrode) of the memristor R1 is connected with a bit line terminal BL1, for example, the memristor R1 may receive a set voltage through the bit line terminal BL1; a second electrode of the transistor M2 may be a drain electrode and configured to be connected with a second electrode (e.g., a negative electrode) of the memristor R2, and a first electrode (e.g., a positive electrode) of the memristor R2 is connected with a bit line terminal BL2, for example, the memristor R2 may receive a set voltage through the bit line terminal BL2.

It should be noted that the transistors M1 and M2 in the memristor unit with the 2T2R structure may also both be P-type transistors, and no details is repeated here.

Figure 4:
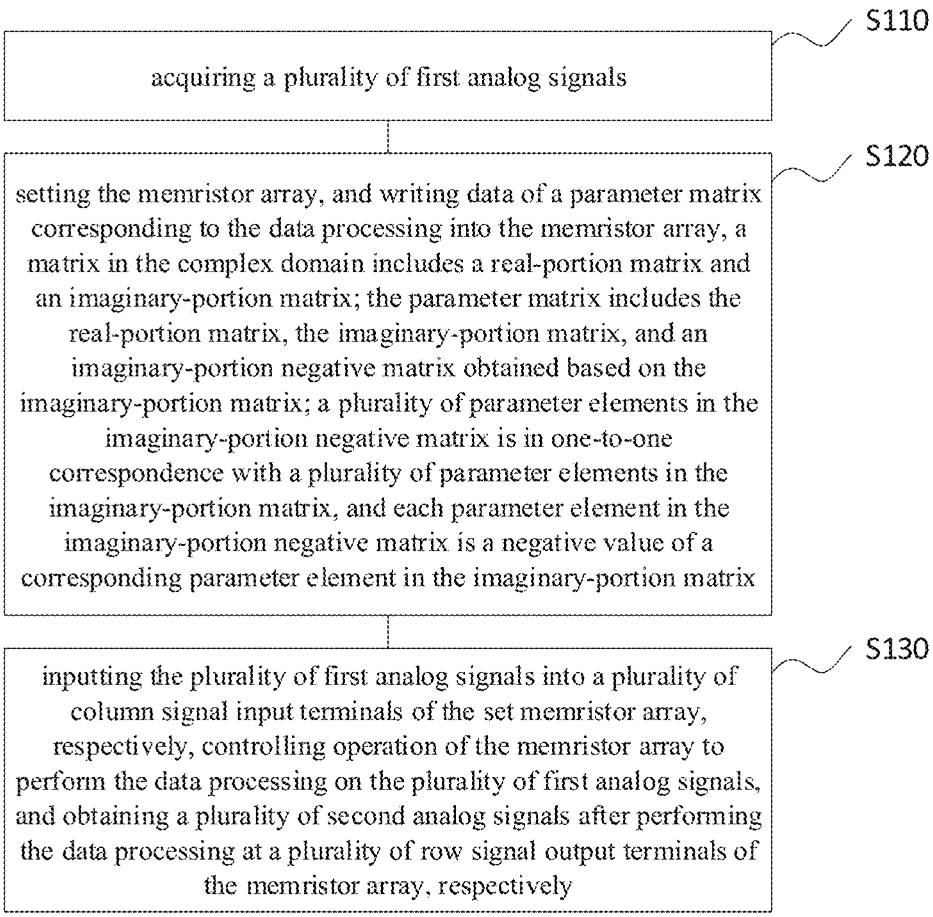
FIG. 4 is a schematic flow chart of a data processing method based on a memristor array provided by at least one embodiment of the present disclosure.

FIG. 4 is a schematic flow chart of a data processing method based on a memristor array provided by at least one embodiment of the present disclosure.

For example, as shown in FIG. 4, the data processing method based on the memristor array provided by the embodiments of the present disclosure includes step S110 to step S130; and the memristor array includes a plurality of memristor units arranged in an array and is configured to be capable of performing a multiplication-addition operation (i.e., a multiplication and accumulation operation: accumulating multiplication results to obtain a sum value of the multiplication-addition results). For example, the structural schematic diagram of the memristor array is as shown in FIG. 2; and each memristor unit may have the 1T1R structure as shown in FIG. 3A or the 2T2R structure as shown in FIG. 3B.

Step S110: acquiring a plurality of first analog signals.

Step S120: setting the memristor array, and writing data of a parameter matrix corresponding to the data processing into the memristor array.

For example, a matrix in the complex domain comprises a real-portion matrix and an imaginary-portion matrix; the parameter matrix comprises the real-portion matrix, the imaginary-portion matrix, and an imaginary-portion negative matrix obtained based on the imaginary-portion matrix.

For example, a plurality of parameter elements in the imaginary-portion negative matrix is in one-to-one correspondence with a plurality of parameter elements in the imaginary-portion matrix, and each parameter element in the imaginary-portion negative matrix is a negative value of a corresponding parameter element in the imaginary-portion matrix. For example, the imaginary-portion negative matrix is obtained by taking a negative value for each parameter element in the imaginary-portion matrix.

Step S130: inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing at a plurality of row signal output terminals of the memristor array, respectively.

For example, the plurality of first analog signals are input signals to be subjected to the data processing, and the plurality of second analog signals are output signals after performing the data processing on the input signals.

For example, the first analog signal is an analog voltage signal, and the second analog signal is an analog current signal.

For example, each of the plurality of first analog signals may include a first real-portion analog signal and a first imaginary-portion analog signal, and each of the plurality of second analog signals may include a second real-portion analog signal and a second imaginary-portion analog signal.

For example, in some examples, calculation formulas for matrix-vector multiplication operation in complex domain may be represented in a form below:

$$y_t = W_t x_t \quad \text{formula (5)}$$

$$W_t = \begin{bmatrix} \text{real} & -img \\ W_{img} & W_{real} \end{bmatrix} \quad \text{formula (6)}$$

$$y_t = [y_{real}, y_{img}]^T \quad \text{formula (7)}$$

$$x_t = [x_{real}, x_{img}]^T \quad \text{formula (8)}$$

For example, the above-described formula (5) is a representation form of the calculation formula for the matrix-vector multiplication in the complex domain; in the above-described formula (6), $W_t$ is the parameter matrix used for the data processing, $W_{real}$ is the real-portion matrix, $W_{img}$ is the imaginary-portion matrix, $-W_{img}$ is the imaginary-portion negative matrix; in the above-described formula (7), $y_t$ is an operation result of the matrix-vector multiplication operation, the operation result includes a real-portion operation result $y_{real}$ and an imaginary-portion operation result $y_{img}$; in the above-described formula (8), $x_t$ is a vector in the complex domain used for the data processing, including a real-portion vector $x_{real}$ and an imaginary-portion vector Xing.

For example, in step S110, acquiring the plurality of first analog signals may include: acquiring the vector $x_t$ in the complex domain used for the data processing, the vector $x_t$ in the complex domain includes the real-portion vector $x_{real}$ and the imaginary-portion vector $x_{img}$; encoding the real-portion vector $x_{real}$ and the imaginary-portion vector $x_{img}$, respectively, to obtain a plurality of first real-portion analog signals and a plurality of first imaginary-portion analog signals.

For example, the vector $x_t$ in the complex domain is encoded into a voltage pulse vector through encoding processing, that is, each parameter element in the real-portion vector $x_{real}$ and the imaginary-portion vector $x_{img}$ is encoded into a corresponding voltage pulse, so as to obtain a first real-portion analog signal corresponding to each parameter element in the real-portion vector $x_{real}$ and a first imaginary-portion analog signal corresponding to each parameter element in the imaginary-portion vector $x_{img}$.

For example, the encoding processing includes analog-to-digital conversion processing. In the encoding process, the parameter element may be encoded by using the number of pulses, or the parameter element may also be encoded by using pulse amplitude encoding. The specific process of encoding processing is not limited in the present disclosure.

For example, the vector $x_t$ in the complex domain used for the data processing may be a digital signal of length N, that is, the real-portion vector $x_{real}$ is a real portion of the digital signal, and the imaginary-portion vector $x_{img}$ is an imaginary portion of the digital signal.

For example, the digital signal may be a pre-stored digital signal; for example, the digital signal may be a digital signal acquired in real time. The digital signal is subjected to digital-to-analog conversion to obtain the plurality of first analog signals.

For example, the memristor array includes a first sub-array, a second sub-array, a third sub-array and a fourth sub-array.

For example, step S120 may include: mapping a plurality of parameter elements in the real-portion matrix to the first sub-array and the fourth sub-array, respectively, in a form of the real-portion matrix, mapping the plurality of parameter elements in the imaginary-portion matrix to the third sub-array in a form of the imaginary-portion matrix, and mapping the plurality of parameter elements in the imaginary-portion negative matrix to the second sub-array in a form of the imaginary-portion negative matrix; the first sub-array and the second sub-array are located in a same row in the memristor array but do not overlap with each other in a row direction, the third sub-array and the fourth sub-array are located in a same row in the memristor array but do not overlap with each other in the row direction, and the first sub-array and the third sub-array do not overlap with each other in a column direction.

For example, the first sub-array and the third sub-array are located in a same column in the memristor array, and the second sub-array and the fourth sub-array are located in a same column in the memristor array.

For example, in some embodiments, the first sub-array and the third sub-array are located in different columns in the memristor array; and the second sub-array and the fourth sub-array are located in different columns in the memristor array. For example, the memristor array $G_t$ may be represented as: $G_t=[G_1, G_2, O_3, O_4; O_1, O_2, G_3, G_4]$, $G_1$ is the first sub-array, $G_2$ is the second sub-array, $G_3$ is the third sub-array, $G_4$ is the fourth sub-array, and memristors in $O_1$, $O_2$, $O_3$ and $O_4$ are in an unmapped initial state. For example, when a memristor is in an unmapped initial state, conductivity of the memristor is close to 0.

Figure 5:
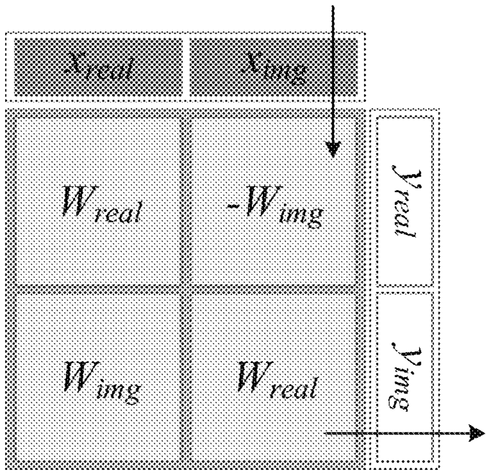
FIG. 5 is a schematic diagram of an implementation principle of a memristor array provided by at least one embodiment of the present disclosure.

FIG. 5 is a schematic diagram of an implementation principle of a memristor array provided by at least one embodiment of the present disclosure.

For example, as shown in FIG. 5, based on the forms of formula (5) to formula (8), the matrix-vector multiplication operation in the complex domain may be implemented by the memristor array, that is, the memristor array is used to represent the parameter matrix $W_t$ composed of $W_{real}$, $-W_{img}$, $W_{real}$ and $W_{img}$.

For example, the plurality of first real-portion analog signals corresponding to the real-portion vector $x_{real}$ are input into $W_{real}$ and $W_{img}$ in the memristor array; and the plurality of first imaginary-portion analog signals corresponding to the imaginary-portion vector $x_{img}$ are input into $-W_{img}$ and $W_{real}$ in the memristor array. Thus, the real-portion operation result $y_{real}$ and the imaginary-portion operation result $y_{img}$ are obtained.

In the method, a portion of the memristor array is directly used to represent the imaginary-portion negative matrix $-W_{img}$, and the multiplication-accumulation operation is directly performed on the memristor array through the Kirchhoff's current law, which reduces overhead of processing circuits such as operational amplifiers arranged in the peripheral of the memristor array to perform addition and subtraction on the operation intermediate results, so that all operation results of the matrix-vector multiplication operation in the complex domain can be obtained in one operation, thereby improving computational efficiency, reducing circuit overhead, and saving circuit area.

Figure 6:
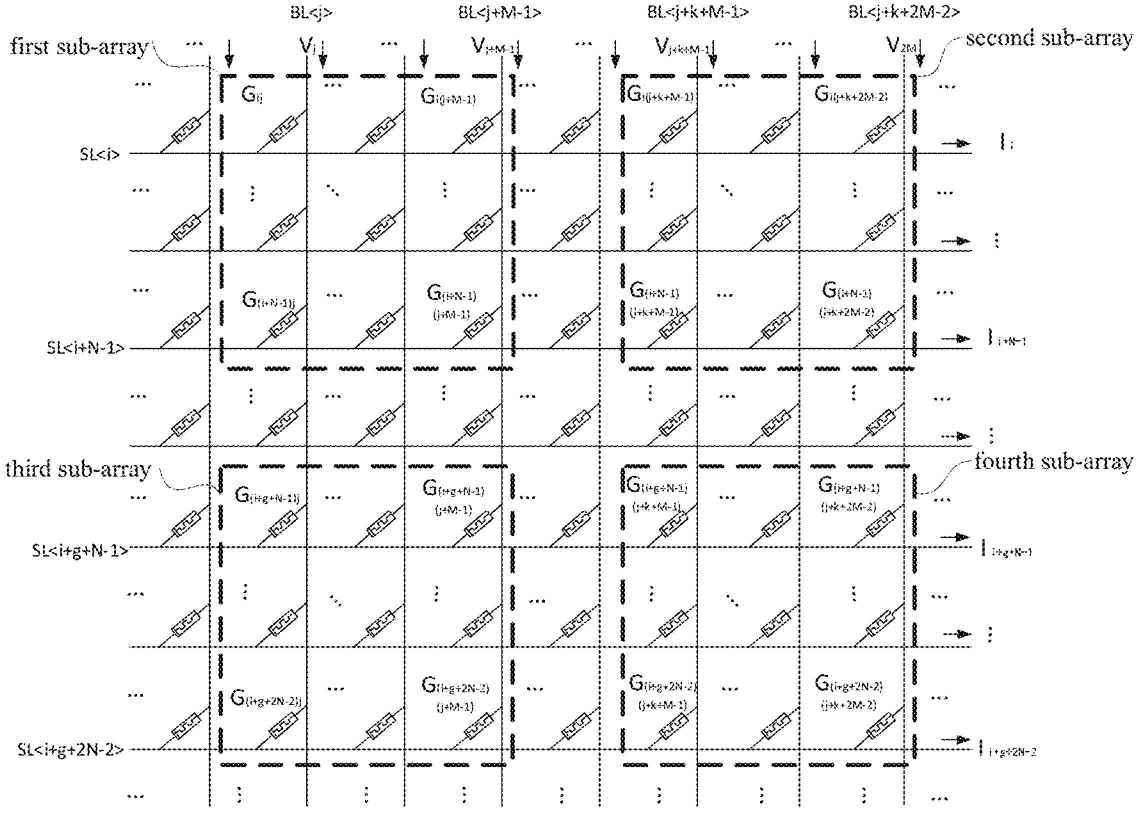
FIG. 6 is a schematic diagram of a memristor array used for data processing provided by at least one embodiment of the present disclosure.

FIG. 6 is a schematic diagram of a memristor array used for data processing provided by at least one embodiment of the present disclosure.

For example, as shown in FIG. 6, the memristor array includes at least 2N rows and 2M columns, where M and N are both positive integers.

For example, as shown in FIG. 6, the memristor array may include a first sub-array, a second sub-array, a third sub-array and a fourth sub-array.

For example, as shown in FIG. 6, SL<i>, SL<i+1>, . . . , SL<i+N−1> represent source lines of an i-th row, an (i+1)-th row, . . . , an (i+N−1)-th row, respectively, and source electrodes of transistors in the first sub-array and the second sub-array are connected with the source lines of the i-th row, the (i+1)-th row, . . . , the (i+N−1)-th row; SL<i+g+N−1>, SL<i+g+N>, . . . , SL<i+g+2N−2> represent source lines of an (i+g+N−1)-th row, an (i+g+N)-th row, . . . , an (i+g+2N−2)-th row, respectively, and source electrodes of transistors in the third sub-array and the fourth sub-array are connected with the source lines of the (i+g+N−1)-th row, the (i+g+N)-th row, . . . , the (i+g+2N−2)-th row.

For example, BL<j>, BL<j+1>, . . . , BL<j+M−1> represent bit lines of a j-th column, a (j+1)-th column, . . . , a (j+M−1)-th column, respectively, and memristors in the memristor units of the first sub-array and the third sub-array are connected with the bit lines of the j-th column, the (j+1)-th column, . . . , the (j+M−1)-th column; BL<j+k+M−1>, BL<j+k+M>, . . . , BL<j+k+2M−2> represent bit lines of a (j+k+M−1)-th column, a (j+k+M)-th column, . . . , a (j+k+2M−2)-th column, respectively, and memristors in the memristor units of the second sub-array and the fourth sub-array are connected with the bit lines of the (j+k+M−1)-th column, the (j+k+M)-th column, . . . , the (j+k+2M−2)-th column; where i, j, k and g are positive integers.

For example, the first sub-array and the second sub-array may be located in a same row in the memristor array but do not overlap with each other in the row direction. For example, the first sub-array includes the i-th row to the (i+N−1)-th row and the j-th column to the (j+M−1)-th column in the memristor array, that is, the first sub-array $G_1=[G_{ij} \ldots G_{i(j+M-1)}; \ldots; G_{(i+N-1)j} \ldots G_{(i+N-1)(j+M-1)}]$; the second sub-array includes the i-th row to the (i+N−1)-th row, and the (j+k+M−1)-th column to the (j+k+2M−2)-th column in the memristor array, that is, the second sub-array $G_2=[G_{i(j+K+M-1)} \ldots G_{i(j+k+2M-2)}; \ldots; G_{(i+N-1)(j+k+M-1)} \ldots G_{(+N-1)(j+k+2M-2)}]$.

For example, the third sub-array and the fourth sub-array may be located in a same row in the memristor array but do not overlap with each other in the row direction; and the first sub-array and the third sub-array do not overlap with each other in the column direction. For example, the third sub-array includes the (i+g+N−1)-th row to the (i+g+2N−2)-th row, and the j-th column to the (j+M−1)-th column in the memristor array, that is, the third sub-array $G_3=[G_{(i+g+N-1)j} \ldots G_{(i+g+N-1)(j+M-1)}; \ldots; G_{(i+g+2N-2)j} \ldots G_{(i+g+2N-2)(j+M-1)}]$; the fourth sub-array includes the (i+g+N−1)-th row to the (i+g+2N−2)-th row, and the (j+k+M−1)-th column to the (j+k+2M−2)-th column in the memristor array, that is, the fourth sub-array $G_4=[G_{(i+g+N-1)(j+k+M-1)} \ldots G_{(i+g+N-1)(j+k+2M-2)}; \ldots; G_{(i+g+2N-2)(j+k+M-1)} \ldots G_{(i+g+2N-2)(j+k+2M-2)}]$.

It should be noted that with respect to DFT such as in formula (1), of which a signal segment length is N. According to formula (3), formula (4) and formula (6), the parameter matrix $W_t$ used for data processing corresponding to the DFT includes 2N rows and 2N columns. Therefore, the memristor array shown in FIG. 6 after the parameter matrix $W_t$ corresponding to the DFT is mapped also includes 2N rows and 2N columns, that is, M equals N. M and N are positive integers.

For example, the real-portion matrix comprises the plurality of parameter elements arranged in an array of N rows and M columns. Mapping the plurality of parameter elements in the real-portion matrix to the first sub-array and the fourth sub-array, respectively, in the form of the real-portion matrix, includes: mapping N parameter elements located in a same row in the real-portion matrix to N memristor units of a same row in the first sub-array, and N memristor units of a same row in the fourth sub-array, respectively; and mapping M parameter elements located in a same column in the real-portion matrix to M memristor units of a same column in the first sub-array, and M memristor units of a same column in the fourth sub-array, respectively.

For example, the imaginary-portion matrix includes the plurality of parameter elements arranged in an array of N rows and M columns. Mapping the plurality of parameter elements in the imaginary-portion matrix to the third sub-array in the form of the imaginary-portion matrix, includes: mapping N parameter elements located in a same row in the imaginary-portion matrix to N memristor units of a same row in the third sub-array, respectively, and mapping M parameter elements located in a same column in the imaginary-portion matrix to M memristor units of a same column in the third sub-array, respectively.

For example, the imaginary-portion negative matrix includes the plurality of parameter elements arranged in an array of N rows and M columns. Mapping the plurality of parameter elements in the imaginary-portion negative matrix to the second sub-array in the form of the imaginary-portion negative matrix, includes: mapping N parameter elements located in a same row in the imaginary-portion negative matrix to N memristor units of a same row in the second sub-array, respectively, and mapping M parameter elements located in a same column in the imaginary-portion negative matrix to M memristor units of a same column in the second sub-array, respectively.

For example, each memristor unit may have a 1T1R structure, as shown in FIG. 3A, that is, each memristor unit includes one memristor, and a corresponding parameter element is represented by a conductivity value of the memristor.

For example, each memristor unit may have a 2T2R structure, as shown in FIG. 3B, that is, each memristor unit includes two memristors; conductivity values of the two memristors may be used to implement a negative value of a parameter element, so that the plurality of memristor units may be used to implement richer and more complex data processing.

For example, in step S130, inputting the plurality of first analog signals into the plurality of column signal input terminals of the set memristor array, respectively, includes: inputting the plurality of first real-portion analog signals into column signal input terminals of the first sub-array and column signal input terminals of the third sub-array, respectively; and inputting the plurality of first imaginary-portion analog signals into column signal input terminals of the second sub-array and column signal input terminals of the fourth sub-array, respectively.

For example, the first sub-array and the third sub-array share a same column signal input terminal, and jointly receive a plurality of first real-portion analog signals obtained based on the real-portion vector $x_{real}$. For example, the second sub-array and the fourth sub-array share a same column signal input terminal, and jointly receive a plurality of first imaginary-portion analog signals obtained based on the imaginary-portion vector $x_{img}$.

For example, the first sub-array and the third sub-array may not share a same column signal input terminal, and the plurality of first real-portion analog signals may be input into the first sub-array and the third sub-array, respectively, through different column signal input terminals. Similarly, the second sub-array and the fourth sub-array may not share a same column signal input terminal, and the plurality of first real-portion analog signals may be input into the second sub-array and the fourth sub-array, respectively, through different column signal input terminals.

For step S130, for example, the plurality of first analog signals may be applied to the plurality of column signal input terminals of the set memristor array, respectively, and meanwhile, the ON signal is applied to the plurality of signal control terminals of the memristor array; a plurality of current signals at the plurality of row signal output terminals of the memristor array are detected and obtained, and a plurality of second analog signals are obtained based on the plurality of current signals.

For example, as shown in FIG. 6, the first real-portion analog signals $V_j, V_{j+1}, \ldots, V_{j+M-1}$ are input at the plurality of column signal input terminals of the bit lines of the j-th column, the (j+1)-th column, . . . , the (j+M−1)-th column; and the first imaginary-portion analog signals $V_{j+k+M-1}, V_{j+k+M}, \ldots, V_{j+k+2M-2}$ are input at the plurality of column signal input terminals of the bit lines of the (j+k+M−1)-th column, the (j+k+M)-th column, . . . , the (j+k+2M−2)-th column. After calculation processing of the memristor units in the first sub-array, the second sub-array, the third sub-array and the fourth sub-array, the second real-portion analog signals $I_i, I_{i+1}, \ldots, I_{i+N-1}$ are output at the row signal output terminals of the source lines of the i-th row, the (i+1)-th row . . . the (i+N−1)-th row; and the second imaginary-portion analog signals $I_{i+g+N-1}, I_{i+g+N}, \ldots, I_{i+g+2N-2}$ are output at the row signal output terminals of the source lines of the (i+g+N−1)-th row, the (i+g+N)-th row, . . . , the (i+g+2N−2)-th row.

For example, in step S130, obtaining the plurality of second analog signals after performing the data processing at the plurality of row signal output terminals of the memristor array, respectively, may include: obtaining a plurality of second real-portion analog signals according to current signals that are output from row signal output terminals of the first sub-array; and obtaining a plurality of second imaginary-portion signals according to current signals that are output from row signal output terminals of the third sub-array.

For example, the data processing method based on the memristor array provided by at least one embodiment of the present disclosure may further include: performing analog-to-digital conversion on the plurality of second analog signals to convert the plurality of second analog signals into a plurality of digital signals, respectively, for subsequent processing.

For example, the analog-to-digital conversion is performed on the plurality of second real-portion analog signals to obtain a real-portion operation result of the matrix-vector multiplication operation in the complex domain, that is, the real-portion operation result $y_{real}$ in formula (7); and the analog-to-digital conversion is performed on the plurality of second imaginary-portion analog signals to obtain an imaginary-portion operation result of the matrix-vector multiplication operation in the complex domain, that is, the imaginary-portion operation result $y_{img}$ in formula (7).

Hereinafter, a mapping relationship between the parameter matrix and the memristor is described and shown in detail, by taking the matrix-vector multiplication operation in the complex domain being discrete Fourier transform as an example.

Figure 7A:
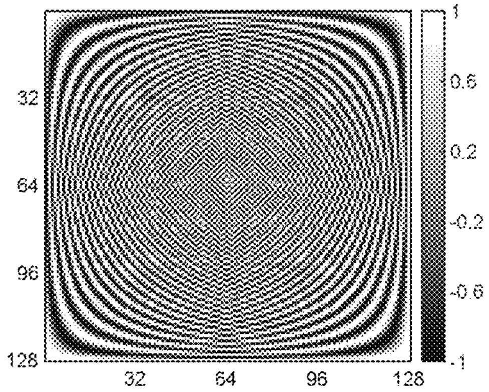
FIG. 7A is a schematic diagram of a heatmap of elements in a real-portion matrix provided by at least one embodiment of the present disclosure.
Figure 7B:
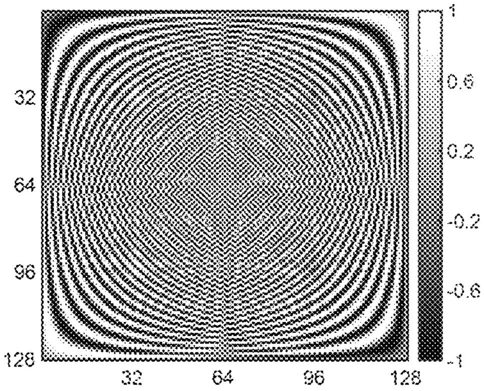
FIG. 7B is a schematic diagram of a heatmap of elements in an imaginary-portion matrix provided by at least one embodiment of the present disclosure.

FIG. 7A is a schematic diagram of a heatmap of elements in a real-portion matrix provided by at least one embodiment of the present disclosure; FIG. 7B is a schematic diagram of a heatmap of elements in an imaginary-portion matrix provided by at least one embodiment of the present disclosure; and FIG. 7C is a schematic diagram of a heatmap of elements in a parameter matrix provided by at least one embodiment of the present disclosure.

Figure 7C:
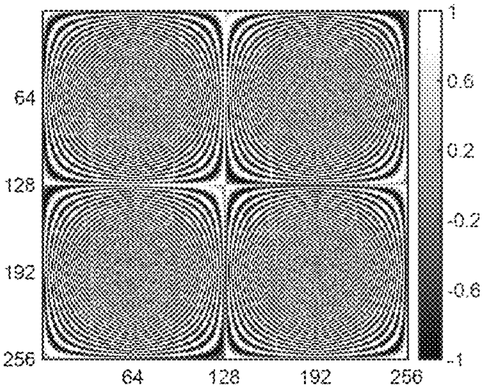
FIG. 7C is a schematic diagram of a heatmap of elements in a parameter matrix provided by at least one embodiment of the present disclosure.

For example, in the heatmaps as shown in FIG. 7A, FIG. 7B and FIG. 7C, horizontal and vertical coordinates represent a signal segment length, and each point determined by the horizontal and vertical coordinates represents a parameter element at a corresponding position in the matrix; a rectangular gradient color bar on a right side of the diagram represents numerical values of parameter elements in different positions in the cloud map, and different numerical values correspond to different grayscale values, ranging from −1 to 1.

For example, the matrix in the complex domain may be a coefficient matrix of discrete Fourier transform. Formula (1) to formula (4) may be referred to for definition and representation of the coefficient matrix. Taking the signal segment length N=128 as an example, according to formula (3) and formula (4), the real-portion matrix $W_{real}$ and the imaginary-portion matrix $W_{img}$ of the DFT are calculated, so as to obtain the heatmap of the real-portion matrix $W_{real}$ as shown in FIG. 7A and the heatmap of the imaginary-portion matrix $W_{img}$ as shown in FIG. 7B. For example, the imaginary-portion negative matrix $-W_{img}$ is obtained by taking a negative value for each parameter element in the imaginary-portion matrix $W_{img}$. The real-portion matrix $W_{real}$, the imaginary-portion matrix $W_{img}$, and the imaginary-portion negative matrix $-W_{img}$ are arranged according to formula (6) to obtain the parameter matrix $W_t$ of the DFT, so as to obtain the heatmap of the parameter matrix $W_t$ as shown in FIG. 7C.

For example, the numerical value of the parameter element may be a positive number or a negative number. For example, each parameter element may be represented by using conductivity values of two memristors, for example, one parameter element may be represented by using a difference between the conductivity values of the two memristor, or one parameter element may be represented by using a sum of the conductivity values of the two memristors.

For example, the parameter matrix may be jointly represented by a first sub-matrix and a second sub-matrix. For example, the parameter matrix includes P rows and Q columns, and a parameter element in an m-th row and an n-th column in the parameter matrix is jointly represented by a parameter element in an m-th row and an n-th column in the first sub-matrix and a parameter element in an m-th row and an n-th column in the second sub-matrix, where m, n, P and Q are positive integers. That is, the parameter element in the m-th row and the n-th column in the parameter matrix is a sum or a difference of the parameter element in the m-th row and the n-th column in the first sub-matrix and the parameter element in the m-th row and the n-th column in the second sub-matrix.

For example, the first sub-matrix includes P rows of first parameter elements, the second sub-matrix includes P rows of second parameter elements, the P rows of first parameter elements are in one-to-one correspondence with the P rows of second parameter elements in terms of row and column position, and the first sub-matrix and the second sub-matrix are arranged in a form of a first matrix of 2P rows and Q columns. For example, the first sub-matrix and the second sub-matrix have a same matrix form as the foregoing parameter matrix.

For example, step S120 may include: mapping the first sub-matrix and the second sub-matrix to the memristor array in the form of the first matrix.

At this time, for step S130, for example, the obtaining the plurality of second analog signals after performing the data processing at the plurality of row signal output terminals of the memristor array, respectively, may include: determining at least one group of rows to be processed, wherein each group of the at least one group of rows to be processed comprises a row of target memristor units corresponding to a row in the P rows of first parameter elements, and a row of target memristor units corresponding to a row in the P rows of second parameter elements that corresponds to a row in the P rows of first parameter elements; and performing current preprocessing on current signals of two row signal output terminals of the plurality of row signal output terminals that respectively correspond to the two rows of target memristor units comprised in each group of the at least one group of rows to be processed, to obtain the plurality of second analog signals corresponding to each group of the at least one group of rows to be processed.

For example, the current preprocessing may be either current subtraction processing or current addition processing.

Figure 8:
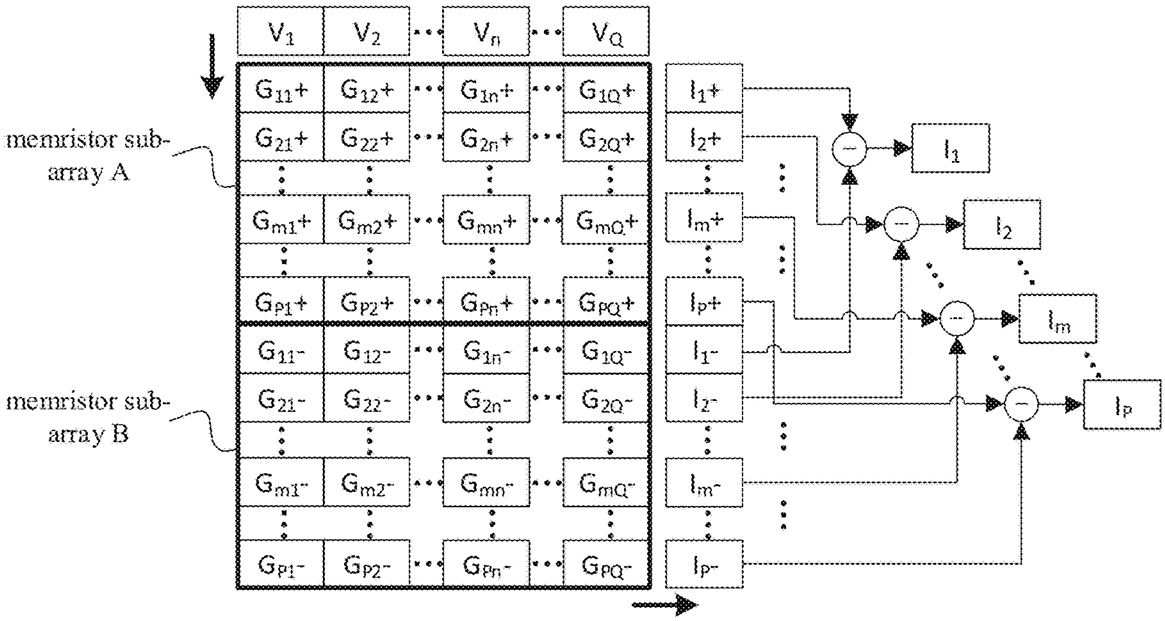
FIG. 8 is a schematic diagram of a memristor array after a parameter matrix being written provided by at least one embodiment of the present disclosure.

FIG. 8 is a schematic diagram of a memristor array after a parameter matrix being written provided by at least one embodiment of the present disclosure.

For example, $V_1$ to $V_Q$ in FIG. 8 are Q first analog signals, which are input to Q column signal input terminals, respectively; $I_{1+}$ to $I_{P+}$ and $I_{1-}$ to $I_{P-}$ in FIG. 8 are 2P current signals that are output from 2P row signal output terminals; and P second analog signals $I_1$ to $I_P$ are obtained based on the 2P current signals, where P and Q are positive integers.

For example, as shown in FIG. 8, the parameter matrix W corresponds to a conductivity matrix $G_0=[G_{11} \ldots G_{1Q}; \ldots; G_{P1} \ldots G_{PQ}]$ of the memristor; the first sub-matrix $W_1$ corresponds to a conductivity matrix $G_{t+}=[G_{11+} \ldots G_{1Q+}; \ldots; G_{P1+} \ldots G_{PQ+}]$ of the memristor; the second sub-matrix $W_2$ corresponds to a conductivity matrix $G_{t-}=[G_{11-} \ldots G_{1Q-}; \ldots; G_{P1-} \ldots G_{PQ-}]$ of the memristor; where G represents a conductivity value of the memristor that corresponds to the numerical value of the parameter element. A conductivity value $G_{mn+}$ corresponding to the parameter element located in the m-th row and the n-th column in the first sub-matrix $W_1$ and a conductivity value $G_{mn-}$ corresponding to the parameter element located in the m-th row and the n-th column in the second sub-matrix $W_2$ jointly represent the conductivity value $G_{mn}$ corresponding to the parameter element for executing the data processing, that is, the parameter matrix W used for executing the data processing is jointly represented by the first sub-matrix $W_1$ and the corresponding second sub-matrix $W_2$.

For example, each parameter element used for executing the data processing may be represented by a difference between parameter elements in corresponding row and column positions in the first sub-matrix $W_1$ and the second sub-matrix $W_2$, so that a negative value of the parameter element may be implemented by using the first sub-matrix and the corresponding second sub-matrix, so as to execute richer and more complex data processing.

For example, the first sub-matrix $W_1$ and the second sub-matrix $W_2$ are arranged in a form of first matrix $W_0$ of 2P rows and Q columns, that is, $W_0$ is mapped to the conductivity matrix $G_t=[G_{11+} \ldots G_{1Q+}; \ldots; G_{P1+} \ldots G_{PQ+}; G_{11-} \ldots G_{1Q-}; \ldots; G_{P1-} \ldots G_{PQ-}]$ of the memristor.

For example, in step S120, the first sub-matrix $W_1$ and the second sub-matrix $W_2$ are mapped to the memristor array in the form of the first matrix $W_0$; for example, the first sub-matrix $W_1$ is mapped as a memristor sub-array A as shown in FIG. 8, and the second sub-matrix $W_2$ is mapped as a memristor sub-array B as shown in FIG. 8. The memristor sub-array A and the memristor sub-array B are as shown in regions marked by thick solid black lines in FIG. 8. The specific mapping process is as described above, and no details is repeated here.

For example, in step S130, a group of rows to be processed corresponding to the memristor array shown in FIG. 8 includes: a row of target memristor units ($G_{m1+}$, $G_{m2+} \ldots G_{mQ+}$) located in an m-th row in the memristor sub-array A (e.g., the m-th row in the memristor array), and a row of target memristor units ($G_{m1-}$, $G_{m2-} \ldots G_{mQ-}$) located in an m-th row in the memristor sub-array B (e.g., the (P+m)-th row in the memristor array). For example, the current preprocessing is performed on a current signal $I_{m+}$ at a row signal output terminal of the m-th row and a current signal $I_{m-}$ at a row signal output terminal of the (P+m)-th row in the memristor array, to obtain the second analog signal $I_m$. By analogy, P second analog signals after performing the data processing are obtained in the above-described mode.

For example, the above-described current preprocessing is current subtraction processing. In other examples, current preprocessing may also be current addition processing.

It should be noted that the mapping state shown in FIG. 8 is only schematic, for example, the first sub-matrix and the second sub-matrix may also be mapped to the memristor array in units of rows, which is not limited in the present disclosure. For example, a first row in parameter elements of the first sub-matrix are mapped to a first row in the memristor array, a first row in parameter elements of the second sub-matrix are mapped to a second row in the memristor array, a second row in parameter elements of the first sub-matrix are mapped to a third row in the memristor array, a second row in parameter elements of the second sub-matrix are mapped to a fourth row in the memristor array, and so on.

For example, it is also possible to use a first memristor array and a second memristor array that are correspondingly arranged, and a current signal at a corresponding row signal output terminal may be preprocessed to obtain the second analog signal, to implement a negative value of a parameter element, so as to execute richer and more complex data processing.

For example, the memristor array includes a first memristor array and a second memristor array, a parameter element in a u-th row and a v-th column in the parameter matrix is jointly represented by a parameter element in a u-th row and a v-th column in a first sub-matrix and a parameter element in a u-th row and a v-th column in a second sub-matrix, where u and v are positive integers, and both the first sub-matrix and the second sub-matrix have a same matrix form as the parameter matrix.

For example, step S120 may include: mapping the first sub-matrix to the first memristor array in a form of the parameter matrix, correspondingly, and mapping the second sub-matrix to the second memristor array in the form of the parameter matrix, correspondingly.

At this time, for step S130, for example, obtaining the plurality of second analog signals after performing the data processing at the plurality of row signal output terminals of the memristor array, respectively, includes: performing current preprocessing on a current signal of each row signal output terminal of the plurality of row signal output terminals in the first memristor array and a current signal of each corresponding row signal output terminal of the plurality of row signal output terminals in the second memristor array, to obtain the plurality of second analog signals.

For example, the current preprocessing may be either current subtraction processing or current addition processing.

Figure 9:
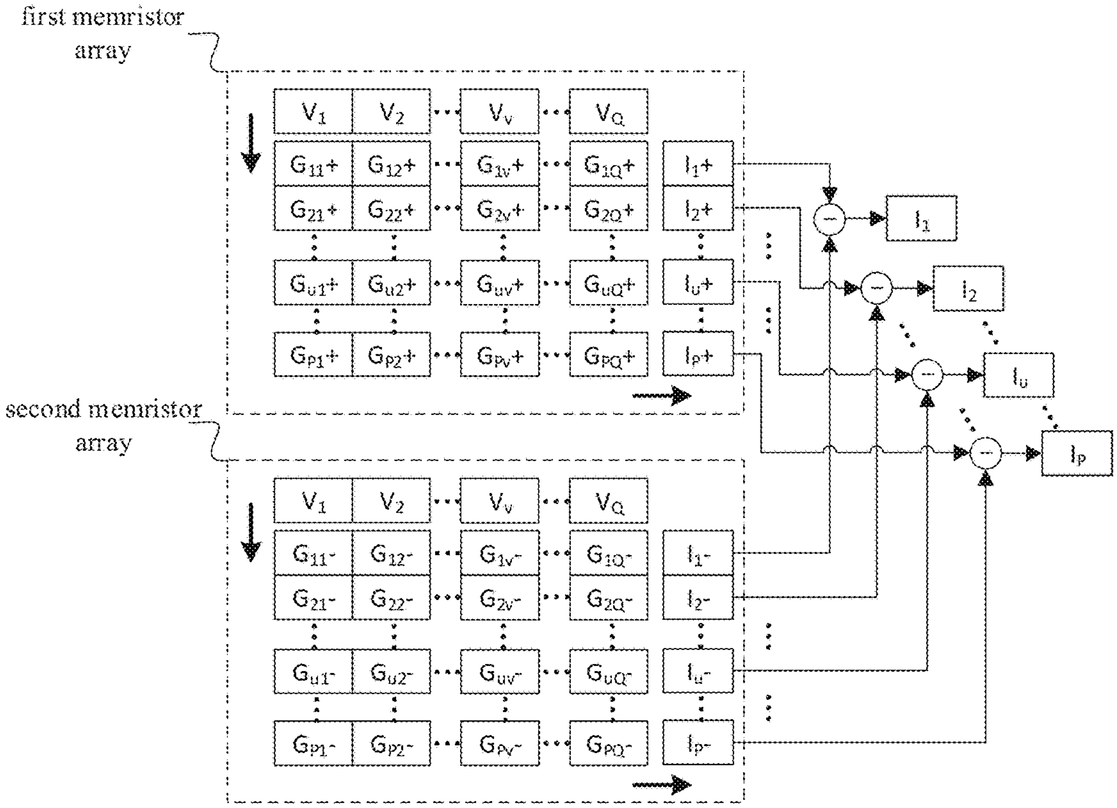
FIG. 9 is a schematic diagram of another memristor array after a parameter matrix being written provided by at least one embodiment of the present disclosure.

FIG. 9 is a schematic diagram of another memristor array after a parameter matrix being written provided by at least one embodiment of the present disclosure, and the embodiment may implement the same data processing as the embodiment shown in FIG. 8.

The memristor array shown in FIG. 9 includes a first memristor array and a second memristor array; each memristor array has an independent control circuit, for example, independent column signal input terminals, to respectively input Q first analog signals $V_1$ to $V_Q$, and independent row signal output terminals, to output a current signal $I_{1+}$ to a current signal $I_{P+}$, and a current signal $I_{1-}$ to a current signal $I_{P-}$. For example, $I_1$ to $I_P$ in FIG. 9 represent P second analog signals after performing the data processing.

For example, the parameter matrix includes P rows and Q columns; and a parameter element in a u-th row and a v-th column in the parameter matrix is jointly represented by a parameter element in a u-th row and a v-th column in a first sub-matrix and a parameter element in a u-th row and a v-th column in a second sub-matrix, where u and v are positive integers. The first sub-matrix and the second sub-matrix both have the same matrix form as the parameter matrix. That is, the first sub-matrix has P rows and Q columns, and the second sub-matrix also has P rows and Q columns; and parameter elements in corresponding row and column positions in the first sub-matrix and the second sub-matrix jointly represent one parameter element for executing the data processing, for example, each parameter element used for executing data processing is represented by a sum or a difference of parameter elements in corresponding row and column positions in the first sub-matrix $W_1$ and the second sub-matrix $W_2$.

For example, the parameter matrix W corresponds to a conductivity matrix $G_0=[G_{11} \ldots G_{1Q}; \ldots; G_{P1} \ldots G_{PQ}]$ of the memristor, the first sub-matrix $W_1$ corresponds to a conductivity matrix $G_{t+}=[G_{11+} \ldots G_{1Q+}; \ldots; G_{P1+} \ldots G_{PQ+}]$ of the memristor, and the second sub-matrix $W_2$ corresponds to a conductivity matrix $G_{t-}=[G_{11-} \ldots G_{1Q-}; \ldots; G_{P1-} \ldots G_{PQ-}]$ of the memristor. A conductivity value $G_{uv+}$ corresponding to the parameter element located in the u-th row and the v-th column in the first sub-matrix $W_1$ and a conductivity value $G_{uv-}$ corresponding to the parameter element located in the u-th row and the v-th column in the second sub-matrix $W_2$ jointly represent a conductivity value $G_{uv}$ corresponding to the parameter element for executing the data processing. That is, the parameter matrix W used for executing the data processing is jointly represented by the first sub-matrix $W_1$ and the corresponding second sub-matrix $W_2$.

For example, each parameter element used for executing the data processing may be represented by a difference between parameter elements in corresponding row and column positions in the first sub-matrix $W_1$ and the second sub-matrix $W_2$, so that a negative value of the parameter element may be implemented by using the first sub-matrix and the corresponding second sub-matrix, so as to execute richer and more complex data processing.

For example, as shown in FIG. 9, in step S120, the first sub-matrix is correspondingly mapped to the first memristor array in the form of the parameter matrix, and the second sub-matrix is correspondingly mapped to the second memristor array in the form of the parameter matrix. The specific mapping process is as described above, and no details is repeated here.

For example, according to step S130, current preprocessing is performed on a current signal $I_{u+}$ of a row signal output terminal of the u-th row in the first memristor array and a current signal $I_{u-}$ of a row signal output terminal of the u-th row in the second memristor array, to obtain the second analog signal $I_u$; by analogy, P second analog signals after performing the data processing are obtained in the above-described mode.

For example, the above-described current preprocessing is current subtraction processing. In other examples, current preprocessing may also be current addition processing.

For example, taking the data processing being the discrete Fourier transform as an example, referring to FIG. 7A to FIG. 7C, the parameter matrix $W_t$ is obtained; and the parameter elements used for executing the data processing in the parameter matrix $W_t$ is represented by the difference between parameter elements in corresponding row and column positions in the first sub-matrix and the second sub-matrix.

Figure 10A:
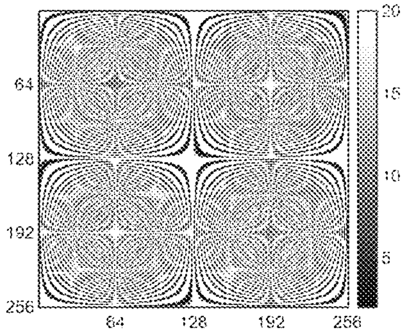
FIG. 10A is a schematic diagram of a heatmap of a conductivity mapping of a first sub-matrix provided by at least one embodiment of the present disclosure.
Figure 10B:
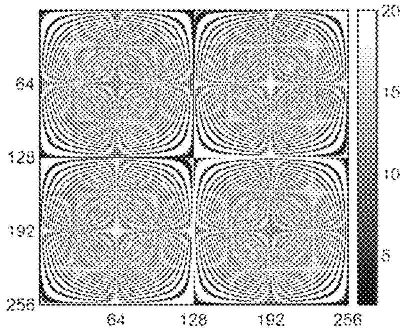
FIG. 10B is a schematic diagram of a heatmap of a conductivity mapping of a second sub-matrix provided by at least one embodiment of the present disclosure.

FIG. 10A is a schematic diagram of a heatmap of a conductivity mapping of a first sub-matrix provided by at least one embodiment of the present disclosure; and FIG. 10B is a schematic diagram of a heatmap of a conductivity mapping of a second sub-matrix provided by at least one embodiment of the present disclosure.

For example, as shown in FIG. 10A and FIG. 10B, the parameter matrix $W_t$ is mapped to the memristor array; lowest memristor conductivity $G_{min}$=2 uS, and highest memristor conductivity $G_{max}$=20 uS are used during mapping, where uS represents the unit of conductivity.

As shown in FIG. 10A, the first sub-matrix $W_1$ is mapped to the first memristor array in the mode of step S120, for example, a corresponding memristor is programmed to a corresponding conductivity state according to the first sub-matrix $W_1$; as shown in FIG. 10B, the second sub-matrix $W_2$ is mapped to the memristor array in the mode of step S120, for example, a corresponding memristor is programmed to a corresponding conductivity state according to the second sub-matrix $W_2$. Parameter elements in the parameter matrix $W_t$ are jointly represented by parameter elements in corresponding row and column positions of the first sub-matrix, which is mapped to the first memristor array, and the second sub-matrix which is mapped to the second memristor array.

In the data processing method based on the memristor array, all results of the matrix-vector multiplication operation in the complex domain can be obtained in one calculation (or one calculation cycle), by negating and integrating the real-portion matrix and the imaginary-portion matrix of the matrix in the complex domain, which greatly reduces area and power consumption overhead of the peripheral circuits that are used for implementing functions such as addition and subtraction in the traditional solution, thereby lowering power consumption, and improving calculation speed.

Figure 11A:
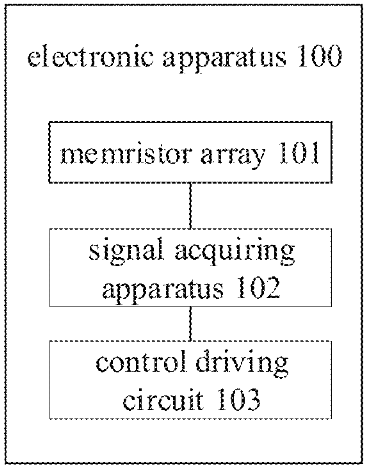
FIG. 11A is a schematic block diagram of an electronic apparatus provided by at least one embodiment of the present disclosure.

Corresponding to the above-described data processing method based on the memristor array, at least one embodiment of the present disclosure further provides an electronic apparatus; and FIG. 11A is a schematic block diagram of an electronic apparatus provided by at least one embodiment of the present disclosure.

As shown in FIG. 11A, the electronic apparatus 100 includes a memristor array 101, a signal acquiring apparatus 102, and a control driving circuit 103. The memristor array 101 is configured to be capable of performing a multiplication-addition operation, to execute the above-described data processing. The signal acquiring apparatus 102 is configured to acquire a plurality of first analog signals. The control driving circuit 103 is configured to execute step S120 to S130.

For example, the memristor array 101 may be the memristor array shown in FIG. 2; the memristor array includes a plurality of memristor units arranged in an array, and the memristor array includes r rows and s columns. For example, each memristor unit includes memristors, each memristor includes a first terminal and a second terminal; and the memristor may be set to an initial state, or may also be set to a set state with a certain resistance value. When the memristor is in the initial state, the resistance value thereof is much greater than resistance in the set state. For example, each memristor unit further includes a switching element, the switching element includes a control terminal, a first electrode, and a second electrode, and the first terminal of the memristor is electrically connected with the first electrode of the switching element.

For example, the memristor array further includes r word lines, r source lines, and s bit lines. The r word lines correspond to the r rows, respectively, and each word line is electrically connected with control terminals of respective switching elements in one row in memristor units; the r source lines correspond to the r rows, and each source line is electrically connected with second electrodes of respective switching elements in one row of memristor units; the s bit lines correspond to the s columns, respectively, and each bit line is electrically connected with second terminals of respective memristors in one column of memristor units.

For example, the signal acquiring apparatus 102 includes a digital signal acquiring circuit and a digital-to-analog converting circuit. For example, the digital signal acquiring circuit is configured to acquire a plurality of initial digital signals; and the digital-to-analog converting circuit is configured to perform digital-to-analog conversion on the plurality of initial digital signals, to respectively obtain the plurality of first analog signals.

For example, the control driving circuit 103 may include a source line driving circuit, a word line driving circuit, and a bit line driving circuit. The source line driving circuit is configured to detect a plurality of second analog signals and execute an initialize operation on the memristor array; the word line driving circuit is configured to apply an ON signal to a plurality of signal control terminals of the memristor array and execute the initialize operation on the memristor array; the bit line driving circuit is configured to apply input signals to a plurality of column signal input terminals and execute the initialize operation on the memristor array, and the input signals at least includes a plurality of first analog signals.

For example, the control driving circuit 103 may apply the input signals to the plurality of column signal input terminals of the memristor array through the bit line driving circuit, simultaneously apply the ON signal to the plurality of signal control terminals of the memristor array through the word line driving circuit, and finally process the current signals of the plurality of row signal output terminals of the set memristor array through the source line driving circuit, to obtain the plurality of second analog signals.

For example, the electronic apparatus 100 may further include a data outputting circuit; the data outputting circuit is configured to convert the plurality of second analog signals into digital signals, so as to respectively convert the plurality of second analog signals into a plurality of digital signals for subsequent processing.

It should be noted that specific description about acquiring the plurality of first analog signals through the signal acquiring apparatus 102 may referred to the relevant description of step S110 shown in FIG. 4 according to the embodiments of the above-described data processing method based on the memristor array, the control driving circuit 103 is configured to implement step S120 to step S130 as shown in FIG. 4, and specific description of the control driving circuit 103 may referred to the relevant description of step S120 to step S130 shown in FIG. 4 according to the embodiment of the above-described data processing method based on the memristor array. In addition, the electronic apparatus may implement technical effects similar to those of the foregoing data processing methods based on the memristor array, and no details is repeated here.

Figure 11B:
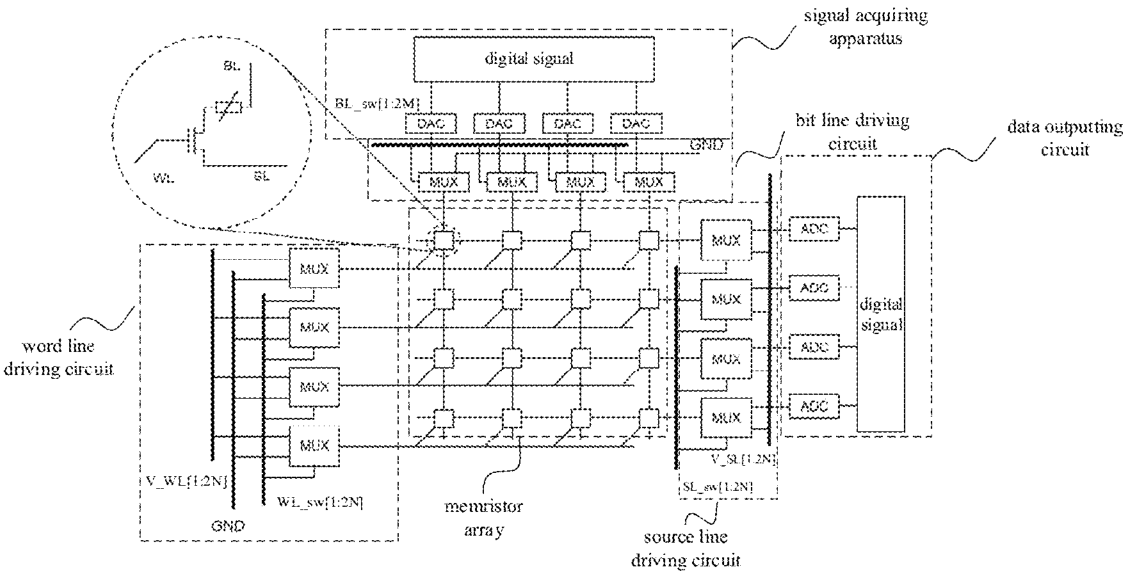
FIG. 11B is a schematic diagram of an electronic apparatus provided by at least one embodiment of the present disclosure.

FIG. 11B is a schematic diagram of an electronic apparatus provided by at least one embodiment of the present disclosure. For example, as shown in FIG. 11B, the electronic apparatus includes a signal acquiring apparatus, a word line driving circuit, a bit line driving circuit, a source line driving circuit, a memristor array, and a data outputting circuit.

For example, the signal acquiring apparatus is configured to convert a digital signal into a plurality of first analog signals through a Digital to Analog converter (DAC), for inputting the plurality of first analog signals to a plurality of column signal input terminals of the memristor array during the data processing.

For example, the matrix used for the matrix-vector multiplication operation in the complex domain has M rows and N columns, where M and N are positive integers; the memristor array at least includes 2N source lines, 2N word lines, and 2M bit lines, as well as a plurality of memristor units arranged in an array of 2N rows and 2M columns (e.g., corresponding to the memristor array of 2N rows and 2M columns in FIG. 6). For example, each memristor unit has a 1T1R structure, and the parameter matrix used for data processing is mapped to the memristor array; the specific process is as described in step S120, and no details is repeated here.

For example, the process of implementing the data processing through the word line driving circuit, the bit line driving circuit, and the source line driving circuit is as described above, and no details is repeated here.

For example, the word line driving circuit includes a plurality of Multiplexers (Mux), configured to switch a word line input voltage; the bit line driving circuit includes a plurality of Multiplexers, configured to switch a bit line input voltage; and the source line driving circuit also includes a plurality of Multiplexers, configured to switch a source line input voltage.

For example, the memristor array includes an operation mode and a calculation mode. When the memristor array is in the operation mode, the memristor unit is in an initialization state, and values of parameter elements in the parameter matrix may be written into the memristor array. For example, the source line input voltage, the bit line input voltage and the word line input voltage of memristors are switched to a corresponding preset voltage interval through the multiplexers.

For example, the word line input voltage is switched to a corresponding voltage interval through a control signal WL_sw[1:2N] of the multiplexers in the word line driving circuit in FIG. 11B. For example, when performing a set operation on the memristors, the word line input voltage is set to 2 volts (V); for example, when performing a reset operation on the memristors, the word line input voltage is set to 5 V; for example, the word line input voltage may be obtained from a voltage signal V_WL[1:2N] in FIG. 11B.

For example, the source line input voltage is switched to a corresponding voltage interval through a control signal SL_sw[1:2N] of the multiplexers in the source line driving circuit in FIG. 11B. For example, when preforming a set operation on the memristors, the word line input voltage is set to 0 V; for example, when performing a reset operation on the memristors, the source line input voltage is set to 2 V; for example, the source line input voltage may be obtained from a voltage signal V_SL[1:2N] in FIG. 11B.

For example, the bit line input voltage is switched to a corresponding voltage interval through a control signal BL_sw[1:2M] of the multiplexers in the bit line driving circuit in FIG. 11B. For example, when performing a set operation on the memristors, the bit line input voltage is set to 2 V; for example, when performing a reset operation on the memristors, the bit line input voltage is set to 0 V; for example, the source line input voltage may be obtained through the DAC in FIG. 11B.

When the memristor array is in the calculation mode, the memristors in the memristor array are in a conductive state that may be used for calculation; the bit line input voltage input by the column signal input terminal does not change the conductivity value of the memristor, so that the memristor array executes the multiplication-addition operation to complete the data processing. For example, the word line input voltage is switched to a corresponding voltage interval through the control signal WL_sw[1:2N] of the multiplexers in the word line driving circuit in FIG. 11B; for example, when an ON signal is applied, the word line input voltage of a corresponding row is set to 5 V; for example, when no ON signal is applied, a word line input voltage of a corresponding row is set to 0 V, for example, a GND signal is accessed; the source line input voltage is switched to a corresponding voltage interval through the control signal SL_sw[1:2N] of the multiplexers in the source line driving circuit in FIG. 11B; for example, the source line input voltage is set to 0 V, so that the current signals from the plurality of row signal output terminals may flow into the data outputting circuit; the bit line input voltage is switched to a corresponding voltage interval through the control signal BL_sw[1:2M] of the multiplexers in the bit line driving circuit in FIG. 11B; for example, the bit line input voltage is set to 0.1 V to 0.3

V, so as to complete the data processing by using the characteristic of the memristor array for the multiplication-addition operation.

For example, the data outputting circuit includes a plurality of Analog to Digital converters (ADCs), which may convert a current signal of the plurality of row signal output terminals into a digital signal for subsequent processing.

Figure 11C:
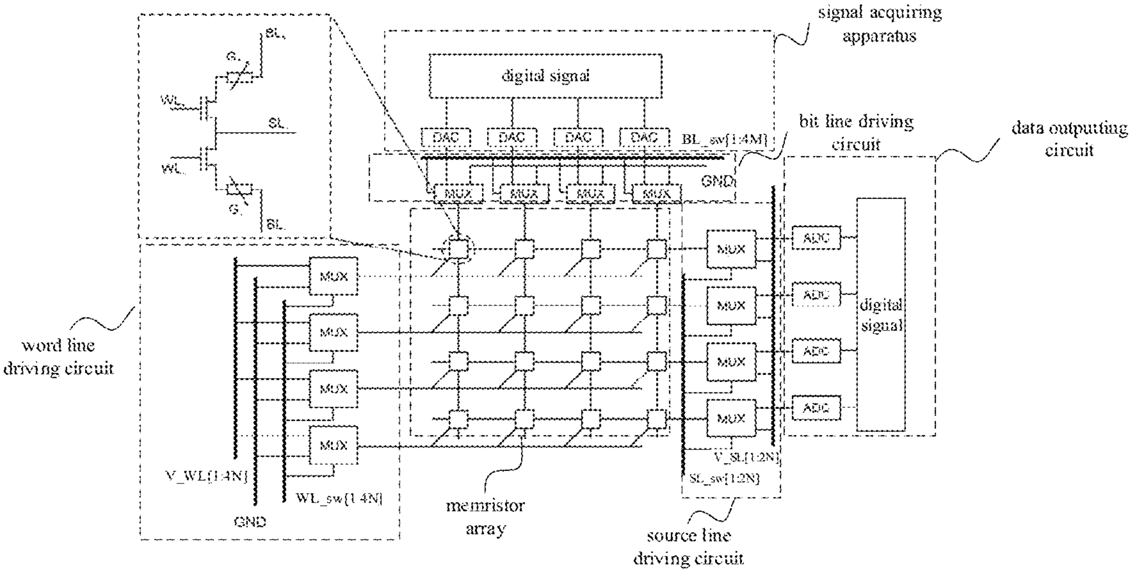
FIG. 11C is a schematic diagram of another electronic apparatus provided by at least one embodiment of the present disclosure.

FIG. 11C is a schematic diagram of another electronic apparatus provided by at least one embodiment of the present disclosure.

The electronic apparatus as shown in FIG. 11C has the same structure as the electronic apparatus as shown in FIG. 11B, and also includes a signal acquiring apparatus, a word line driving circuit, a bit line driving circuit, a source line driving circuit, a memristor array, and a data outputting circuit.

For example, the memristor array includes 2N source lines, 4N word lines, and 4M bit lines, as well as a plurality of memristor units arranged in an array of 2N rows and 2M columns (e.g., corresponding to the memristor array of 2N rows and 2M columns in FIG. 6). For example, each memristor unit has a 2T2R structure; the parameter matrix used for the data processing is mapped multiple times to a plurality of different sub-arrays in the memristor array; the specific process is as described in step S120, and no details is repeated here.

It should be noted that the memristor array may also include 2N source lines, 2N word lines, and 4M bit lines, as well as a plurality of memristor units arranged in an array of 2N rows and 2M columns. Since the ON signal is simultaneously applied to the plurality of signal control terminals of the memristor array when executing step S130, two memristors in each row of the memristor units may be controlled simultaneously by each word line.

The description of the signal acquiring apparatus, the control driving circuit, and the data outputting circuit is as described above, and no details is repeated here.

The above description is only preferred embodiments of the present disclosure and explanation of the applied technical principles. Those skilled in the art should understand that the scope of disclosure involved in the present disclosure is not only limited to the technical solutions formed by the specific combination of the above-described technical features, but also covers other technical solutions formed by an arbitrary combination of the above-described technical features or equivalent features thereof without departing from the above-described disclosure concept. For example, the above-described features and the technical features, which are disclosed in the present disclosure (but not limited thereto) and with similar functions, are replaced with each other to form a technical solution.

Furthermore, although the respective operations are described in a particular order, this should not be understood as requiring the operations to be executed in the particular order shown or in a sequential order. Under certain circumstances, multitasking and parallel processing may be favorable. Similarly, although the above discussion includes a number of specific implementation details, these should not be interpreted as limiting the scope of the present disclosure. Certain features as described in the context of separate embodiments may also be implemented in a single embodiment in combination. Conversely, various features as described in the context of a single embodiment may also be implemented in a plurality of embodiments individually or in any suitable sub-combination.

Although the subject matter has been described in terms specific to the structural features and/or method logic actions, it should be understood that the subject matter defined in the appended claims is not necessarily limited to the specific features or actions as described above. On the contrary, the specific features and actions as described above are only examples for implementing the claims.

The following points need to be noted:

(1) In the drawings of the embodiments of the present disclosure, only the structures related to the embodiments of the present disclosure are involved, and other structures may refer to the common design(s).

(2) In case of no conflict, features in one embodiment or in different embodiments of the present disclosure may be combined.

The above are merely particular embodiments of the present disclosure but are not limitative to the scope of the present disclosure; any of those skilled familiar with the related arts may easily conceive variations and substitutions in the technical scopes disclosed by the present disclosure, which should be encompassed in protection scopes of the present disclosure. Therefore, the scopes of the present disclosure should be defined in the appended claims.

The invention claimed is:

1. A data processing method based on a memristor array, wherein the data processing comprises a matrix-vector multiplication operation in complex domain, the memristor array comprises a plurality of memristor units arranged in an array and is configured to be capable of performing a multiplication-addition operation, the data processing method comprises:

acquiring a plurality of first analog signals;

setting the memristor array, and writing data of a parameter matrix corresponding to the data processing into the memristor array, wherein a matrix in the complex domain comprises a real-portion matrix and an imaginary-portion matrix; the parameter matrix comprises the real-portion matrix, the imaginary-portion matrix, and an imaginary-portion negative matrix obtained based on the imaginary-portion matrix; a plurality of parameter elements in the imaginary-portion negative matrix is in one-to-one correspondence with a plurality of parameter elements in the imaginary-portion matrix, and each parameter element in the imaginary-portion negative matrix is a negative value of a corresponding parameter element in the imaginary-portion matrix; and inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing at a plurality of row signal output terminals of the memristor array, respectively, wherein the memristor array comprises a first sub-array, a second sub-array, a third sub-array and a fourth sub-array, setting the memristor array, and writing the data of the parameter matrix corresponding to the data processing into the memristor array, comprises:

mapping a plurality of parameter elements in the real-portion matrix to the first sub-array and the fourth sub-array, respectively, in a form of the real-portion matrix, mapping the plurality of parameter elements in the imaginary-portion matrix to the third sub-array in a form of the imaginary-portion matrix, and mapping the plurality of parameter elements in the imaginary-portion negative matrix to the second sub-array in a form of the imaginary-portion negative matrix, wherein the first sub-array and the second sub-array are located in a same row in the memristor array but do not overlap with each other in a row direction, the third sub-array and the fourth sub-array are located in a same row in the memristor array but do not overlap with each other in the row direction, and the first sub-array and the third sub-array do not overlap with each other in a column direction.

2. The data processing method according to claim 1, wherein the first sub-array and the third sub-array are located in a same column in the memristor array, and the second sub-array and the fourth sub-array are located in a same column in the memristor array.

3. The data processing method according to claim 1, wherein the memristor array comprises at least 2N rows and 2M columns, the first sub-array comprises an i-th row to an (i+N−1)-th row and a j-th column to a (j+M−1)-th column in the memristor array, the second sub-array comprises an i-th row to an (i+N−1)-th row, and a (j+k+M−1)-th column to a (j+k+2*M−2)-th column in the memristor array, the third sub-array comprises an (i+g+N−1)-th row to an (i+g+2N−2)-th row, and a j-th column to a (j+M−1)-th column in the memristor array, the fourth sub-array comprises an (i+g+N−1)-th row to an (i+g+2N−2)-th row, and a (j+k+M−1)-th column to a (j+k+2*M−2)-th column in the memristor array, and wherein M, N, i, j, k and g are positive integers.

4. The data processing method according to claim 1, wherein the real-portion matrix comprises the plurality of parameter elements arranged in an array of N rows and M columns, mapping the plurality of parameter elements in the real-portion matrix to the first sub-array and the fourth sub-array, respectively, in the form of the real-portion matrix, comprises:

mapping N parameter elements located in a same row in the real-portion matrix to N memristor units of a same row in the first sub-array, and N memristor units of a same row in the fourth sub-array, respectively; and mapping M parameter elements located in a same column in the real-portion matrix to M memristor units of a same column in the first sub-array, and M memristor units of a same column in the fourth sub-array, respectively.

5. The data processing method according to claim 1, wherein each of the plurality of first analog signals comprises a first real-portion analog signal and a first imaginary-portion analog signal, acquiring the plurality of first analog signals, comprises:

acquiring a vector in the complex domain used for the data processing, wherein the vector in the complex domain comprises a real-portion vector and an imaginary-portion vector; and encoding the real-portion vector and the imaginary-portion vector, respectively, to obtain a plurality of first real-portion analog signals and a plurality of first imaginary-portion analog signals.

6. The data processing method according to claim 5, wherein inputting the plurality of first analog signals into the plurality of column signal input terminals of the set memristor array, respectively, comprises:

inputting the plurality of first real-portion analog signals into column signal input terminals of the first sub-array and column signal input terminals of the third sub-array, respectively; and inputting the plurality of first imaginary-portion analog signals into column signal input terminals of the second sub-array and column signal input terminals of the fourth sub-array, respectively.

7. The data processing method according to claim 1, wherein each of the plurality of second analog signals comprises a second real-portion analog signal and a second imaginary-portion analog signal, the first sub-array and the second sub-array share a same row signal output terminal, and the third sub-array and the fourth sub-array share a same row signal output terminal, obtaining the plurality of second analog signals after performing the data processing at the plurality of row signal output terminals of the memristor array, respectively, comprises:

obtaining a plurality of second real-portion analog signals according to current signals that are output from row signal output terminals of the first sub-array; and obtaining a plurality of second imaginary-portion signals according to current signals that are output from row signal output terminals of the third sub-array.

8. The data processing method according to claim 7, further comprising:

performing analog-to-digital conversion on the plurality of second analog signals to obtain a real-portion operation result of the matrix-vector multiplication operation; and performing the analog-to-digital conversion on the plurality of second imaginary-portion analog signals to obtain an imaginary-portion operation result of the matrix-vector multiplication operation.

9. The data processing method according to claim 1, wherein the parameter matrix is represented as:

$$W_t = \begin{bmatrix} W_{real} & -W_{img} \\ W_{img} & W_{real} \end{bmatrix}$$

wherein $W_{real}$ is the real-portion matrix, $W_{img}$ is the imaginary-portion matrix, and $-W_{img}$ is the imaginary-portion negative matrix.

10. The data processing method according to claim 1, wherein the parameter matrix comprises P rows and Q columns, and a parameter element in an m-th row and an n-th column in the parameter matrix is jointly represented by a parameter element in an m-th row and an n-th column in a first sub-matrix and a parameter element in an m-th row and an n-th column in a second sub-matrix, wherein m, n, P and Q are positive integers, the first sub-matrix comprises P rows of first parameter elements, the second sub-matrix comprises P rows of second parameter elements, the P rows of first parameter elements are in one-to-one correspondence with the P rows of second parameter elements in terms of row and column position, the first sub-matrix and the second sub-matrix are arranged in a form of a first matrix of 2P rows and Q columns, and setting the memristor array, and writing the data of the parameter matrix corresponding to the data processing into the memristor array, comprises:

mapping the first sub-matrix and the second sub-matrix to the memristor array in the form of the first matrix.

11. The data processing method according to claim 10, wherein obtaining the plurality of second analog signals after performing the data processing at the plurality of row signal output terminals of the memristor array, respectively, comprises:

determining at least one group of rows to be processed, wherein each group of the at least one group of rows to be processed comprises a row of target memristor units corresponding to a row in the P rows of first parameter elements, and a row of target memristor units corresponding to a row in the P rows of second parameter elements that corresponds to a row in the P rows of first parameter elements; and performing current preprocessing on current signals of two row signal output terminals of the plurality of row signal output terminals that respectively correspond to the two rows of target memristor units comprised in each group of the at least one group of rows to be processed, to obtain the plurality of second analog signals corresponding to each group of the at least one group of rows to be processed.

12. The data processing method according to claim 1, wherein the memristor array comprises a first memristor array and a second memristor array, a parameter element in a u-th row and a v-th column in the parameter matrix is jointly represented by a parameter element in a u-th row and a v-th column in a first sub-matrix and a parameter element in a u-th row and a v-th column in a second sub-matrix, wherein u and v are positive integers, both the first sub-matrix and the second sub-matrix have a same matrix form as the parameter matrix, and setting the memristor array, and writing the data of the parameter matrix corresponding to the data processing into the memristor array, comprises:

mapping the first sub-matrix to the first memristor array in a form of the parameter matrix, correspondingly, and mapping the second sub-matrix to the second memristor array in the form of the parameter matrix, correspondingly.

13. The data processing method according to claim 12, wherein obtaining the plurality of second analog signals after performing the data processing at the plurality of row signal output terminals of the memristor array, respectively, comprises:

performing current preprocessing on a current signal of each row signal output terminal of the plurality of row signal output terminals in the first memristor array and a current signal of each corresponding row signal output terminal of the plurality of row signal output terminals in the second memristor array, to obtain the plurality of second analog signals.

14. The data processing method according to claim 11, wherein the current preprocessing is current subtraction processing or current addition processing.

15. The data processing method according to claim 1, wherein the data processing is discrete Fourier transform, and the matrix in the complex domain is a coefficient matrix of the discrete Fourier transform, the real-portion matrix is a real portion of the coefficient matrix, and the imaginary-portion matrix is an imaginary portion of the coefficient matrix.

16. An electronic apparatus, comprising:

a memristor array, configured to be capable of performing a multiplication-addition operation;

a signal acquiring apparatus, configured to acquire a plurality of first analog signals;

a control driving circuit, configured to execute steps of:

setting the memristor array, and writing data of a parameter matrix corresponding to the data processing into the memristor array, wherein a matrix in the complex domain comprises a real-portion matrix and an imaginary-portion matrix; the parameter matrix comprises the real-portion matrix, the imaginary-portion matrix, and an imaginary-portion negative matrix obtained based on the imaginary-portion matrix; a plurality of parameter elements in the imaginary-portion negative matrix is in one-to-one correspondence with a plurality of parameter elements in the imaginary-portion matrix, and each parameter element in the imaginary-portion negative matrix is a negative value of a corresponding parameter element in the imaginary-portion matrix; and inputting the plurality of first analog signals into a plurality of column signal input terminals of the set memristor array, respectively, controlling operation of the memristor array to perform the data processing on the plurality of first analog signals, and obtaining a plurality of second analog signals after performing the data processing at a plurality of row signal output terminals of the memristor array, respectively, wherein the memristor array comprises a first sub-array, a second sub-array, a third sub-array and a fourth sub-array, the control driving circuit, when executing setting the memristor array, and writing the data of the parameter matrix corresponding to the data processing into the memristor array, is configured to execute steps of:

mapping a plurality of parameter elements in the real-portion matrix to the first sub-array and the fourth sub-array, respectively, in a form of the real-portion matrix, mapping the plurality of parameter elements in the imaginary-portion matrix to the third sub-array in a form of the imaginary-portion matrix, and mapping the plurality of parameter elements in the imaginary-portion negative matrix to the second sub-array in a form of the imaginary-portion negative matrix, wherein the first sub-array and the second sub-array are located in a same row in the memristor array but do not overlap with each other in a row direction, the third sub-array and the fourth sub-array are located in a same row in the memristor array but do not overlap with each other in the row direction, and the first sub-array and the third sub-array do not overlap with each other in a column direction.

17. The data processing method according to claim 13, wherein the current preprocessing is current subtraction processing or current addition processing.

* * * * *